US011328780B1

(12) United States Patent
Xu et al.

(10) Patent No.: US 11,328,780 B1
(45) Date of Patent: May 10, 2022

(54) REDUCED VERIFY SCHEME DURING PROGRAMMING BASED ON SPACING BETWEEN VERIFY LEVELS

(71) Applicant: SanDisk Technologies LLC, Addison, TX (US)

(72) Inventors: Huiwen Xu, Cupertino, CA (US); Jun Wan, San Jose, CA (US); Bo Lei, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/116,579

(22) Filed: Dec. 9, 2020

(51) Int. Cl.
*G11C 16/04* (2006.01)
*G11C 16/34* (2006.01)
*G11C 16/26* (2006.01)
*G11C 16/10* (2006.01)
*G11C 16/08* (2006.01)

(52) U.S. Cl.
CPC .......... *G11C 16/3459* (2013.01); *G11C 16/08* (2013.01); *G11C 16/10* (2013.01); *G11C 16/26* (2013.01); *G11C 16/3418* (2013.01); *G11C 16/3454* (2013.01)

(58) Field of Classification Search
CPC .................. G11C 16/0483; G11C 16/3454
USPC ........................ 365/185.17, 185.22
See application file for complete search history.

(56) References Cited

U.S. PATENT DOCUMENTS

| | | | |
|---|---|---|---|
| 7,224,614 B1 | 5/2007 | Chan | |
| 7,643,348 B2 | 1/2010 | Cernea | |
| 7,688,638 B2 | 3/2010 | Hemink | |
| 8,432,740 B2 | 4/2013 | Li | |
| 8,953,386 B2 | 2/2015 | Dutta et al. | |
| 9,286,987 B1* | 3/2016 | Dong | G11C 16/0483 |
| 10,014,063 B2 | 7/2018 | Tseng et al. | |
| 10,748,622 B2 | 8/2020 | Lin et al. | |
| 10,811,109 B2 | 10/2020 | Baraskar et al. | |

* cited by examiner

*Primary Examiner* — Jason Lappas
(74) *Attorney, Agent, or Firm* — Vierra Magen Marcus LLP

(57) ABSTRACT

Apparatuses and techniques are described for optimizing a program operation in a memory device in which groups of memory cells are programmed from checkpoint states to respective data states. In a first program pass, groups of memory cells are programmed to respective checkpoint states with verify tests. Each checkpoint state is associated with a set of data states. In a second program pass, the memory cells are programmed closer to their assigned data state with a specified number of program pulses. In a third program pass, the memory cells are programmed to their assigned data state by applying program pulses and performing verify tests. The number of checkpoint states and the number of data states associated with each checkpoint state can be optimized based on a spacing between the verify voltages of the data states.

20 Claims, 25 Drawing Sheets

Fig. 1A
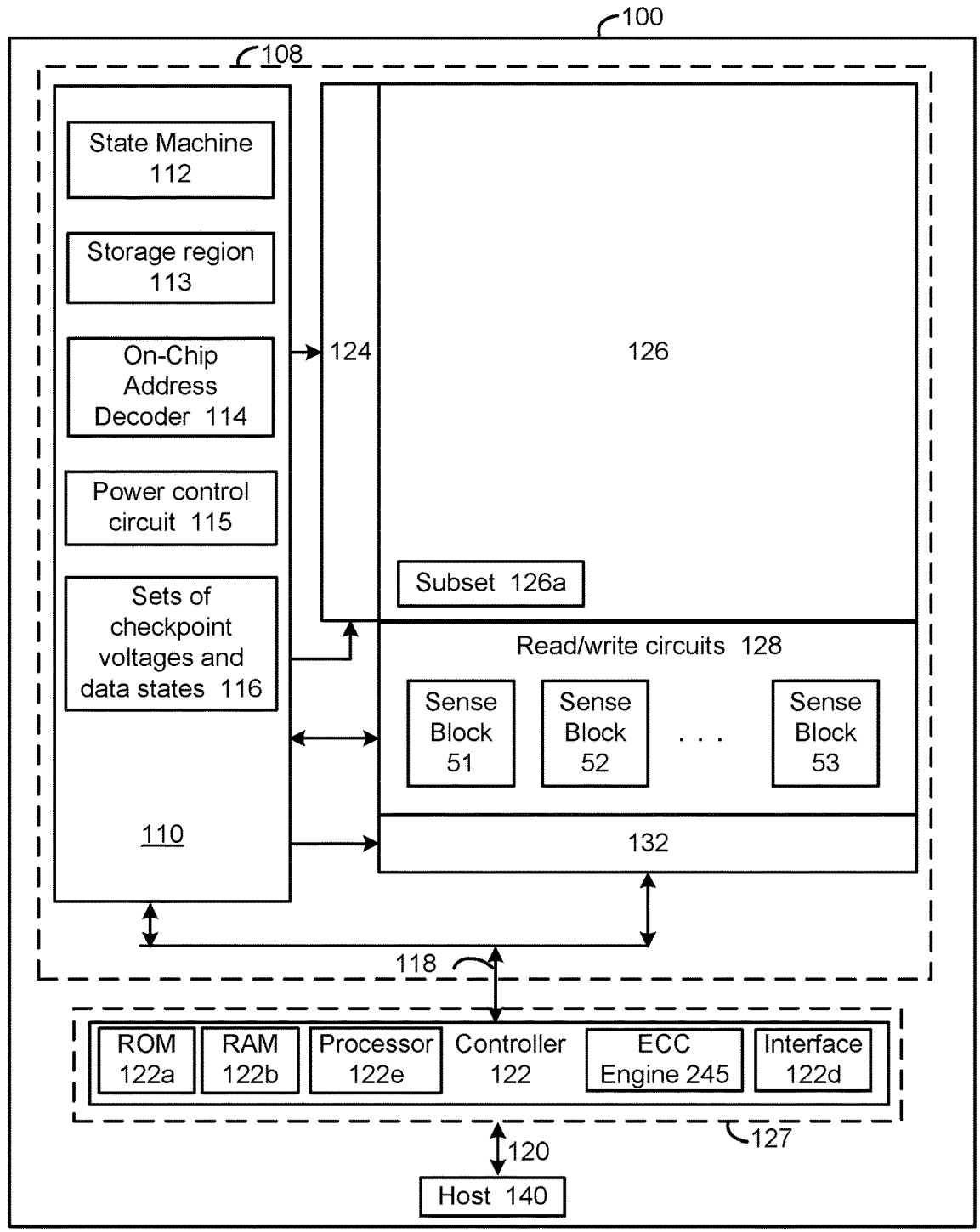
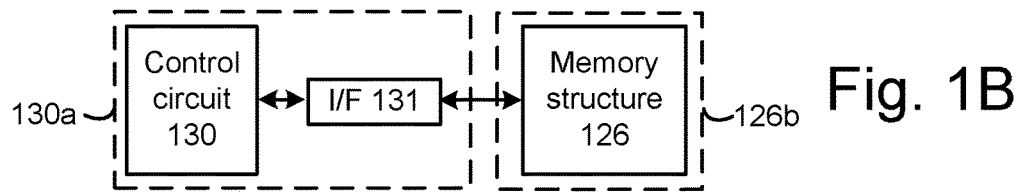
Fig. 1B

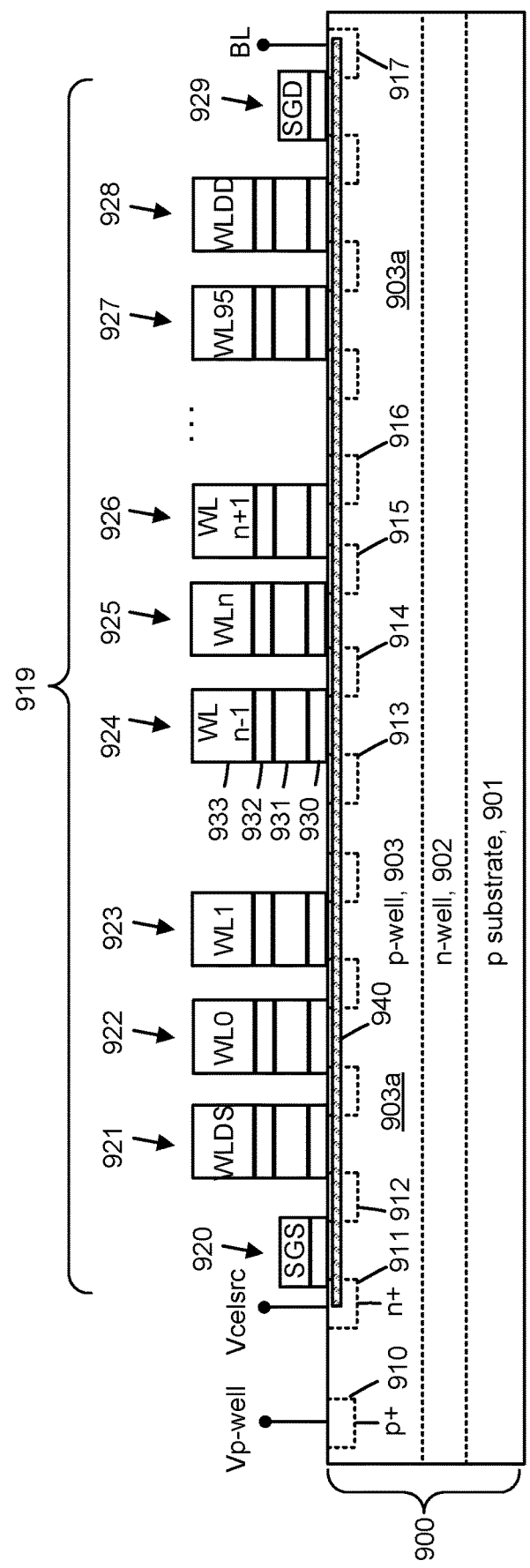

Fig. 10A

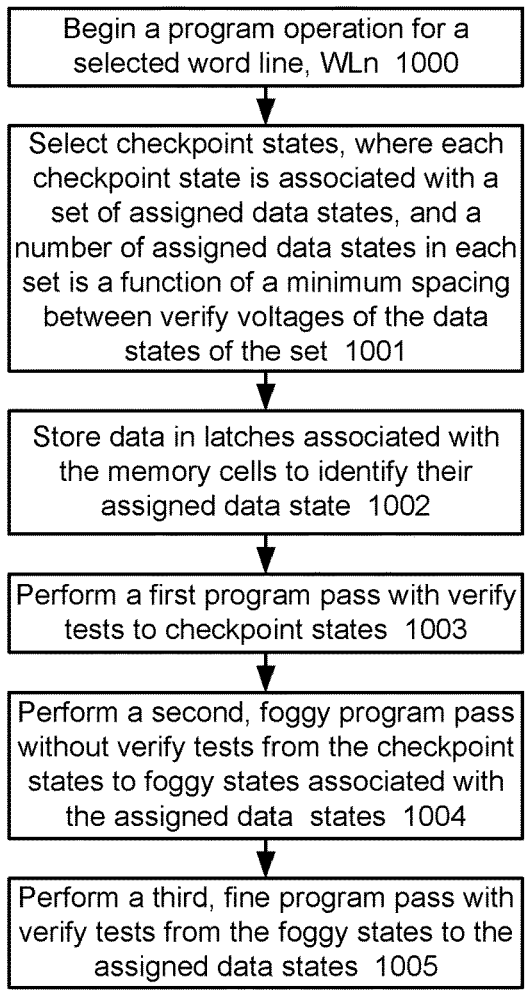

Begin a program operation for a selected word line, WLn  1000

Select checkpoint states, where each checkpoint state is associated with a set of assigned data states, and a number of assigned data states in each set is a function of a minimum spacing between verify voltages of the data states of the set  1001

Store data in latches associated with the memory cells to identify their assigned data state  1002

Perform a first program pass with verify tests to checkpoint states  1003

Perform a second, foggy program pass without verify tests from the checkpoint states to foggy states associated with the assigned data states  1004

Perform a third, fine program pass with verify tests from the foggy states to the assigned data states  1005

Fig. 10B1

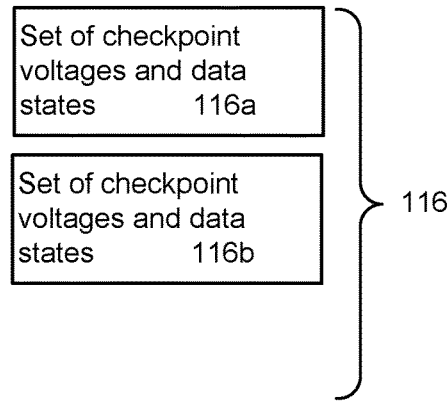

Set of checkpoint voltages and data states  116a

Set of checkpoint voltages and data states  116b

| MC grp. | CP/Vverify | DS set | Data states/Vverify | Min. spacing | # states |
|---|---|---|---|---|---|
| GRP1 | CP1/Vcp1 | Set(1) | S1-S4/VS1-VS4 | medium (d1) | 4 |
| GRP2 | CP2/Vcp2 | Set(2) | S5-S7/VS5-VS7 | low (d2) | 3 |
| GRP3 | CP3/Vcp3 | Set(3) | S8-S10/VS8-VS10 | low (d2) | 3 |
| GRP4 | CP4/Vcp4 | Set(4) | S11-S15/VS11-VS15 | high (d3) | 5 |

| MC grp. | CP/Vverify | DS set | Data states/Vverify | Min. spacing | # states |
|---|---|---|---|---|---|
| GRP1a | CP1/Vcp1a | Set(1a) | S1-S5/VS1a-VS5a | high (d4) | 5 |
| GRP2a | CP2/Vcp2a | Set(2a) | S6-S9/VS6a-VS9a | medium (d5) | 4 |
| GRP3a | CP3/Vcp3a | Set(3a) | S10-S12/VS10a-VS12a | low (d6) | 3 |
| GRP4a | CP4/Vcp4a | Set(4a) | S13-S15/VS13a-VS15a | low (d7) | 3 |

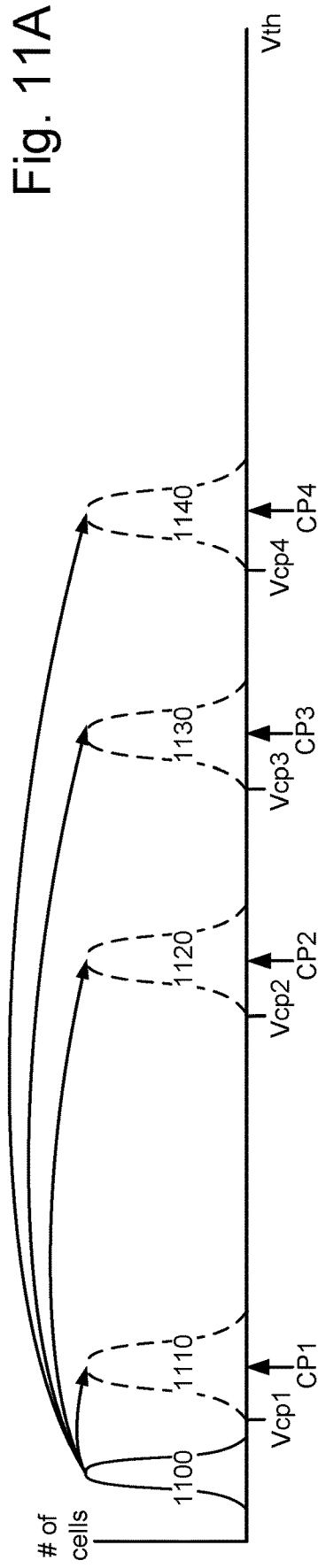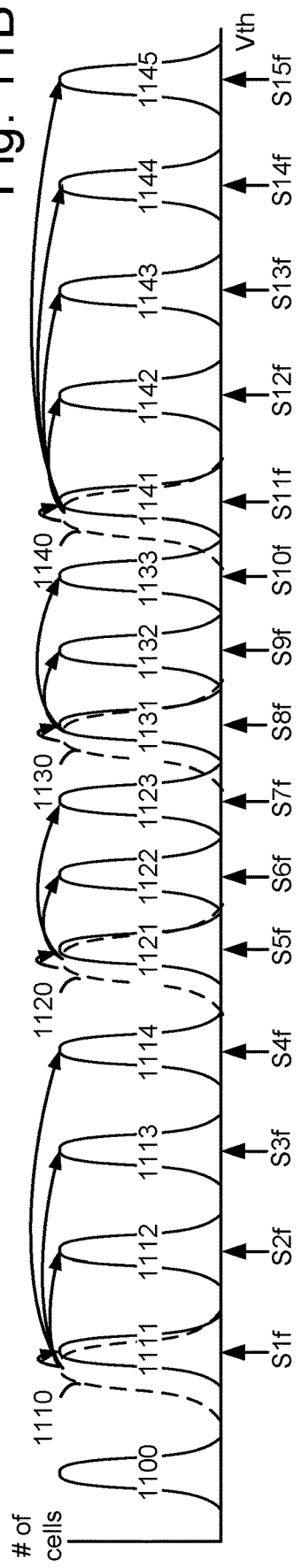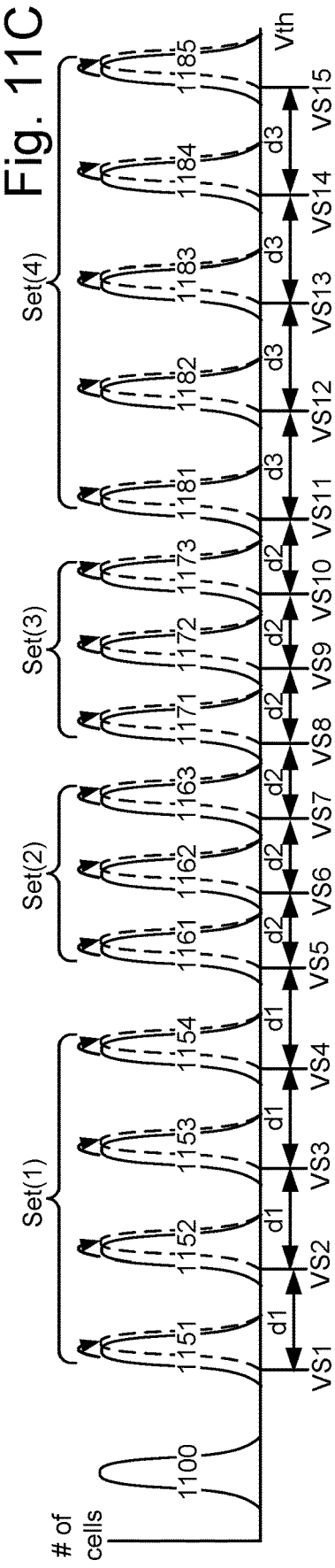

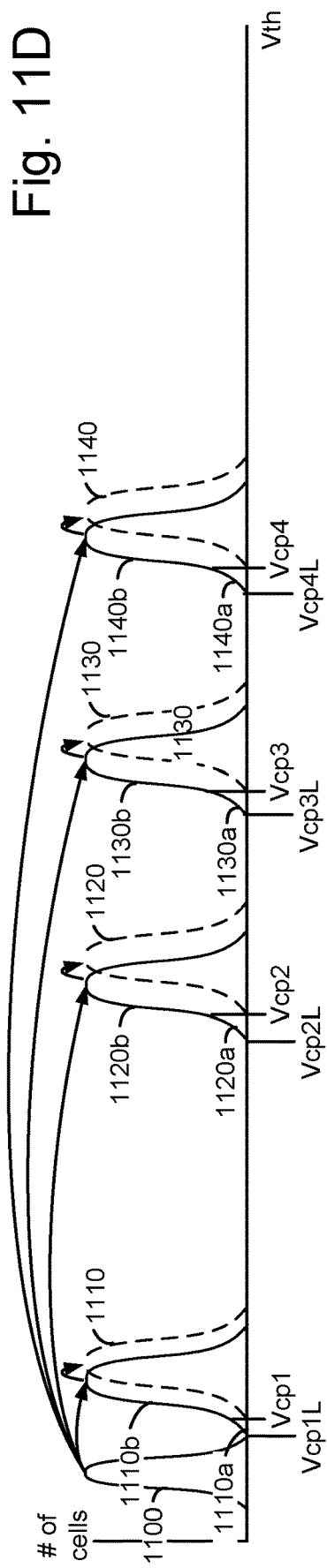
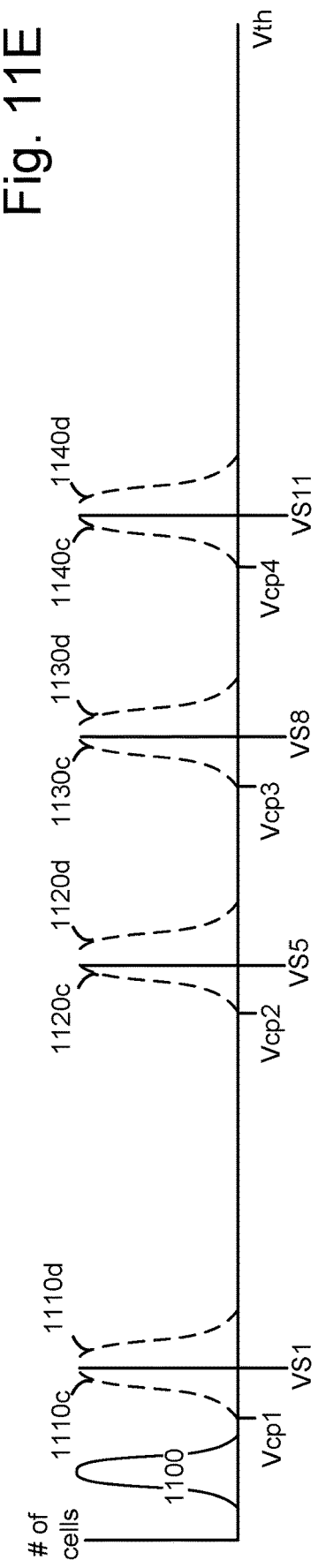

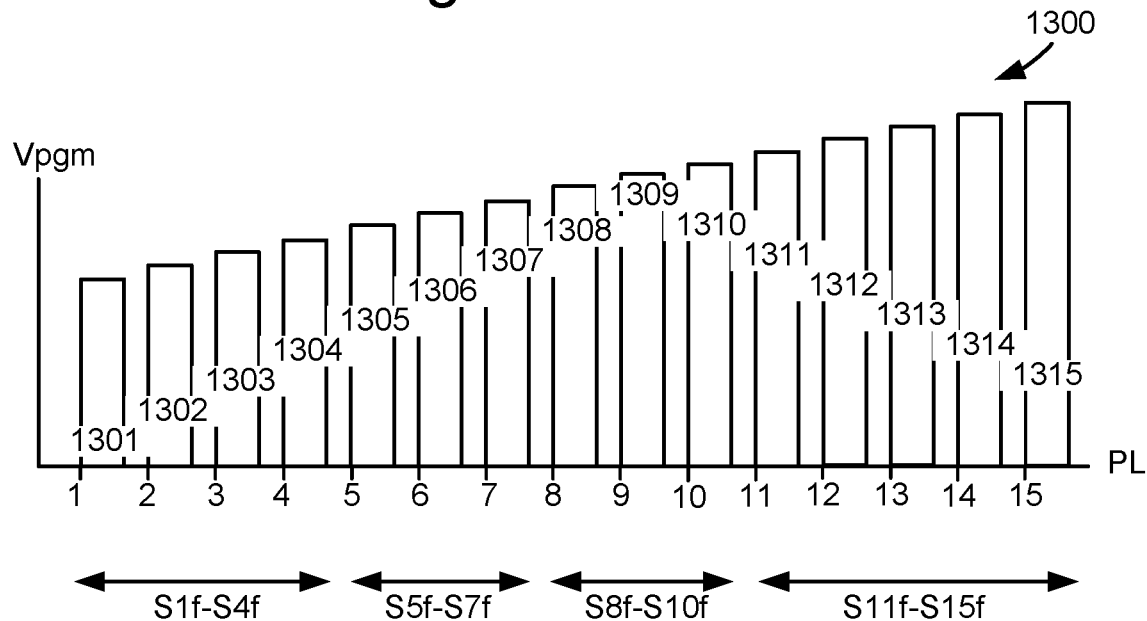

| PL# | Vbl (S1) | Vbl (S2) | Vbl (S3) | Vbl (S4) |
|---|---|---|---|---|
| 1 | full speed | full speed | full speed | full speed |
| 2 | inhibit | full speed | full speed | full speed |
| 3 | inhibit | inhibit | full speed | full speed |
| 4 | inhibit | inhibit | inhibit | full speed |

| PL# | Vbl (S5) | Vbl (S6) | Vbl (S7) |
|---|---|---|---|
| 5 | full speed | full speed | full speed |
| 6 | inhibit | full speed | full speed |
| 7 | inhibit | inhibit | full speed |

| PL# | Vbl (S8) | Vbl (S9) | Vbl (S10) |
|---|---|---|---|
| 8 | full speed | full speed | full speed |
| 9 | inhibit | full speed | full speed |
| 10 | inhibit | inhibit | full speed |

| PL# | Vbl (S11) | Vbl (S12) | Vbl (S13) | Vbl (S14) | Vbl (S15) |
|---|---|---|---|---|---|
| 11 | full speed | full speed | full speed | full speed | full speed |
| 12 | inhibit | full speed | full speed | full speed | full speed |
| 13 | inhibit | inhibit | full speed | full speed | full speed |
| 14 | inhibit | inhibit | inhibit | full speed | full speed |
| 15 | inhibit | inhibit | inhibit | inhibit | full speed |

Fig. 13C

| PL# | Vbl (S1) | Vbl (S2) | Vbl (S3) | Vbl (S4) |
|---|---|---|---|---|
| 1 | partial speed | full speed | full speed | full speed |
| 2 | inhibit | partial speed | full speed | full speed |
| 3 | inhibit | inhibit | partial speed | full speed |
| 4 | inhibit | inhibit | inhibit | partial speed |

| PL# | Vbl (S5) | Vbl (S6) | Vbl (S7) |
|---|---|---|---|
| 5 | partial speed | full speed | full speed |
| 6 | inhibit | partial speed | full speed |
| 7 | inhibit | inhibit | partial speed |

| PL# | Vbl (S8) | Vbl (S9) | Vbl (S10) |
|---|---|---|---|
| 8 | partial speed | full speed | full speed |
| 9 | inhibit | partial speed | full speed |
| 10 | inhibit | inhibit | partial speed |

| PL# | Vbl (S11) | Vbl (S12) | Vbl (S13) | Vbl (S14) | Vbl (S15) |
|---|---|---|---|---|---|
| 11 | partial speed | full speed | full speed | full speed | full speed |
| 12 | inhibit | partial speed | full speed | full speed | full speed |
| 13 | inhibit | inhibit | partial speed | full speed | full speed |
| 14 | inhibit | inhibit | inhibit | partial speed | full speed |
| 15 | inhibit | inhibit | inhibit | inhibit | partial speed |

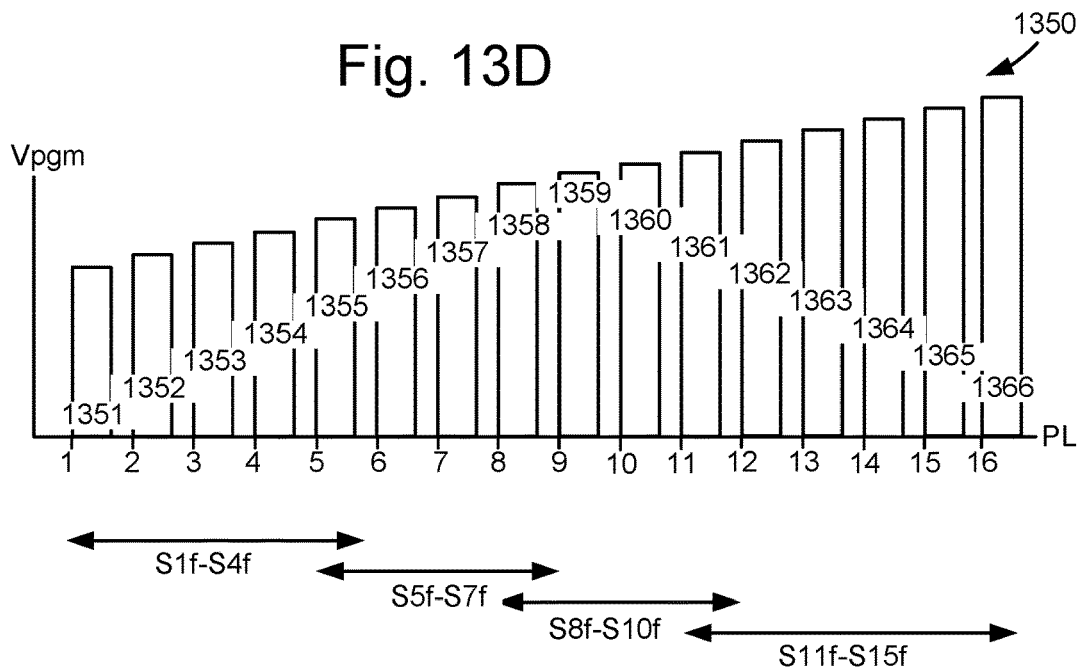

| PL# | Vbl (S1) | Vbl (S2) | Vbl (S3) | Vbl (S4) |
|---|---|---|---|---|
| 1 | full pgm | full pgm | full pgm | full pgm |
| 2 | partial pgm | full pgm | full pgm | full pgm |
| 3 | inhibit | partial pgm | full pgm | full pgm |
| 4 | inhibit | inhibit | partial pgm | full pgm |
| 5 | inhibit | inhibit | inhibit | partial pgm |

| PL# | Vbl (S5) | Vbl (S6) | Vbl (S7) |
|---|---|---|---|
| 5 | full pgm | full pgm | full pgm |
| 6 | partial pgm | full pgm | full pgm |
| 7 | inhibit | partial pgm | full pgm |
| 8 | inhibit | inhibit | partial pgm |

| PL# | Vbl (S8) | Vbl (S9) | Vbl (S10) |
|---|---|---|---|
| 8 | full pgm | full pgm | full pgm |
| 9 | partial pgm | full pgm | full pgm |
| 10 | inhibit | partial pgm | full pgm |
| 11 | inhibit | inhibit | partial pgm |

| PL# | Vbl (S11) | Vbl (S12) | Vbl (S13) | Vbl (S14) | Vbl (S15) |
|---|---|---|---|---|---|
| 11 | full pgm | full pgm | full pgm | full pgm | full pgm |
| 12 | partial pgm | full pgm | full pgm | full pgm | full pgm |
| 13 | inhibit | partial pgm | full pgm | full pgm | full pgm |
| 14 | inhibit | inhibit | partial pgm | full pgm | full pgm |
| 15 | inhibit | inhibit | inhibit | partial pgm | full pgm |
| 16 | inhibit | inhibit | inhibit | inhibit | partial pgm |

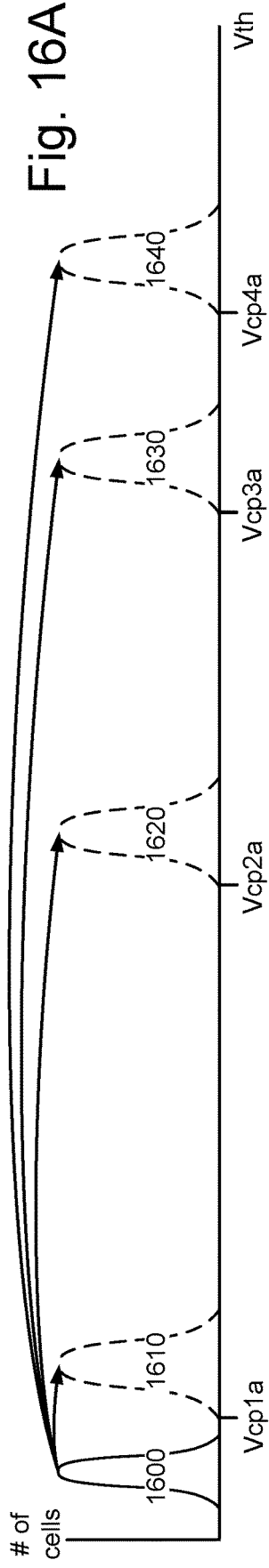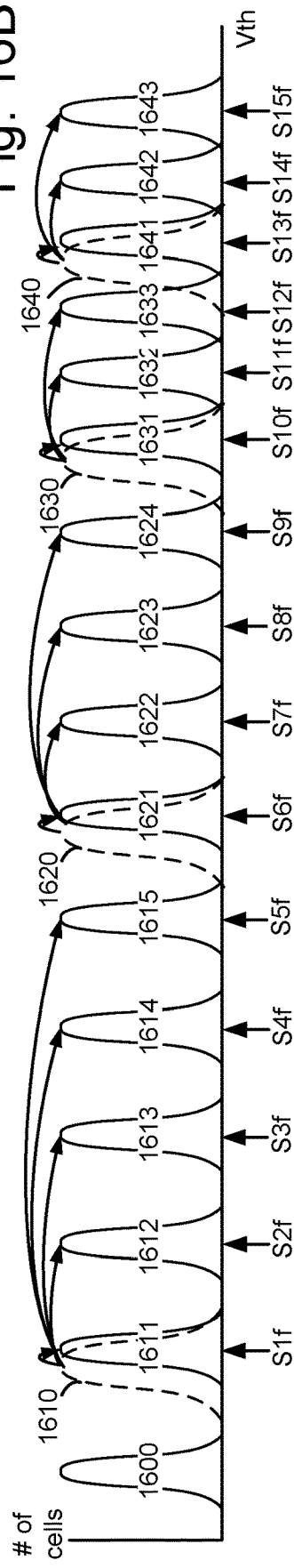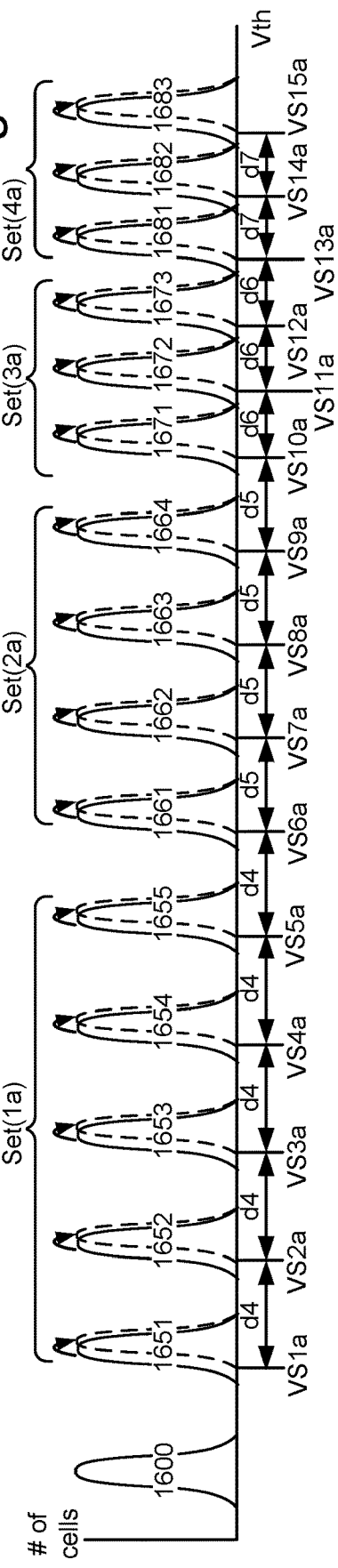

Fig. 19

| | S0/Er | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| UP  | 1 | 0 | 0 | 0 | 0 | 0 | 0 | 0 | 0 | 1 | 1 | 1 | 1 | 1 | 1 | 1 |
| UMP | 1 | 0 | 0 | 0 | 0 | 1 | 1 | 1 | 1 | 0 | 0 | 0 | 0 | 1 | 1 | 1 |
| LMP | 1 | 0 | 0 | 1 | 1 | 0 | 0 | 1 | 1 | 0 | 0 | 1 | 1 | 0 | 0 | 1 |
| LP  | 1 | 0 | 1 | 0 | 1 | 0 | 1 | 0 | 1 | 0 | 1 | 0 | 1 | 0 | 1 | 0 |

Set(1): S1–S4, Set(2): S5–S8, Set(3): S9–S12, Set(4): S13–S15

REDUCED VERIFY SCHEME DURING PROGRAMMING BASED ON SPACING BETWEEN VERIFY LEVELS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130*a* communicates with the memory structure 126 on a separate second die 126*b*.

FIG. 9 depicts an example NAND string in a 2D configuration.

FIG. 10A depicts a flowchart of an example program operation which optimizes the number and configuration of checkpoint states.

FIG. 10B1 depicts an example of sets of checkpoint voltages and data states 116, consistent with FIG. 1A and FIG. 10A at step 1001.

FIG. 10B2 depicts a table with an example of the set of checkpoint voltages and data states 116*a* of FIG. 10B1.

FIG. 10B3 depicts a table with an example of the set of checkpoint voltages and data states 116*b* of FIG. 10B1.

FIG. 11A depicts threshold voltage distributions after a first program pass in a first example program operation, consistent with FIG. 10C, where verify tests are performed using checkpoint voltages Vcp1-Vcp4.

FIG. 11B depicts threshold voltage distributions after a second program pass in a first example program operation, consistent with FIG. 10D.

FIG. 11C depicts threshold voltage distributions after a third program pass in a first example program operation, consistent with FIG. 10E, where verify tests are performed using verify voltages VS1-VS15.

FIG. 11D depicts threshold voltage distributions in a variation of FIG. 11A, where an offset voltage (Vcp1L-Vcp4L) is used to trigger partial speed programming.

FIG. 11E depicts threshold voltage distributions in a variation of FIG. 11A, where verify voltages VS1, VS5, VS8 and VS11 are used to distinguish lower and upper tail memory cells to guide the second program pass.

FIG. 13A depicts a first example of a program voltage signal in a second program pass which provides the threshold voltage distributions of FIG. 11B.

FIG. 13B depicts a first example of bit line voltages which can be used in connection with the program voltage signal of FIG. 13A.

FIG. 13C depicts a second example of bit line voltages which can be used in connection with the program voltage signal of FIG. 13A.

FIG. 13D depicts a second example of a program voltage signal in a second program pass which provides the threshold voltage distributions of FIG. 11B.

FIG. 13E depicts an example of bit line voltages which can be used in connection with the program voltage signal of FIG. 13D.

FIG. 16A depicts threshold voltage distributions after a first program pass in a second example program operation, consistent with FIG. 10C, where verify tests are performed using checkpoint voltages Vcp1*a*-Vcp4*a*.

FIG. 16B depicts threshold voltage distributions after a second program pass in a second example program operation, consistent with FIG. 10D.

FIG. 16C depicts threshold voltage distributions after a third program pass in a second example program operation, consistent with FIG. 10E, where verify tests are performed using verify voltages VS1a-VS15a.

FIG. 19 depicts an example of latch data, consistent with FIG. 10A, step 1002.

DETAILED DESCRIPTION

Figure 2:
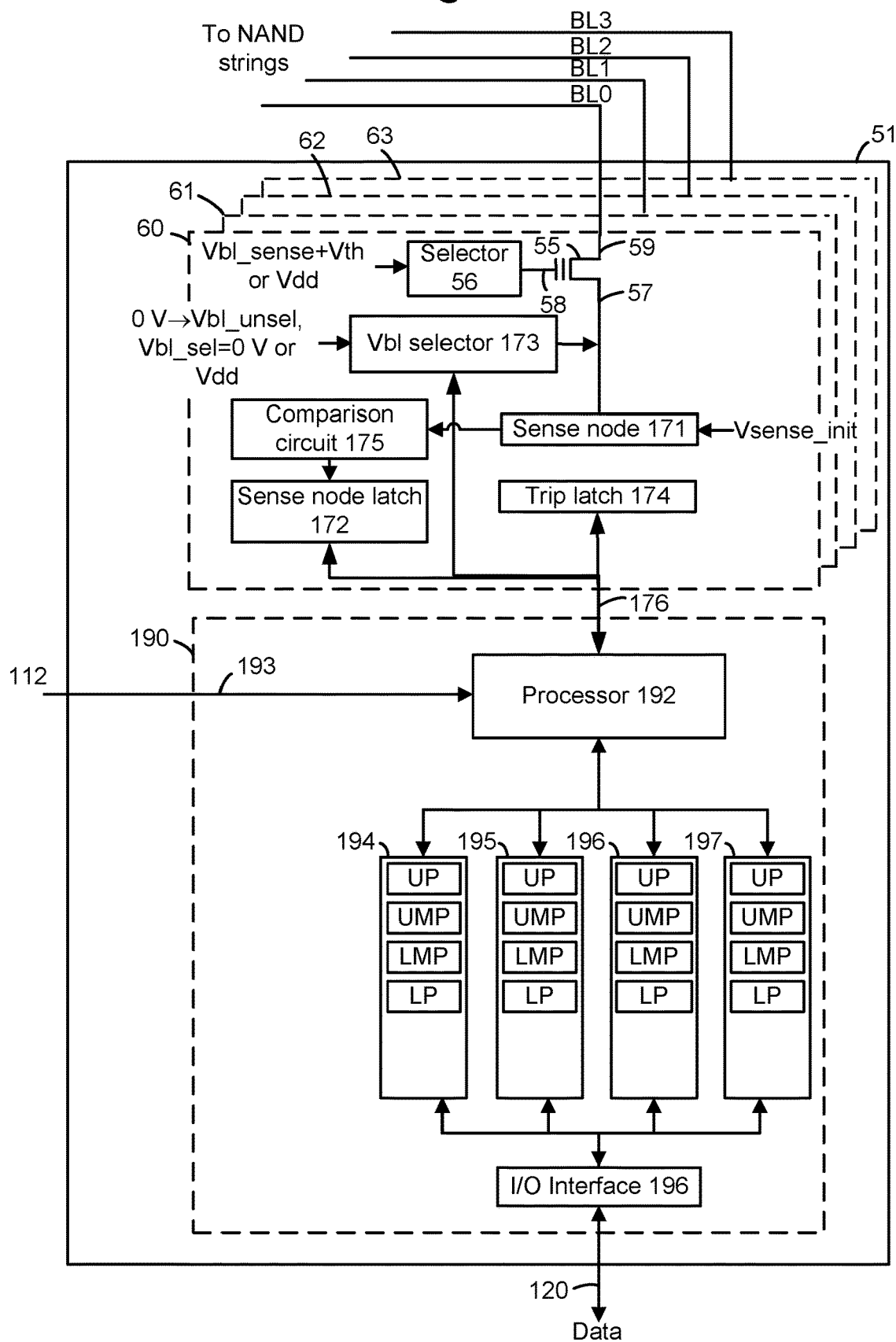
FIG. 2 is a block diagram depicting one embodiment of the sense block 51 of FIG. 1A.

Apparatuses and techniques are described for optimizing a program operation in a memory device in which groups of memory cells are programmed from checkpoint states to respective data states.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts as a control gate. A set of word lines extends from the source-side of a block to the drain-side of a block. See FIG. 8, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5A and 6, for example.

In a 2D memory structure, the memory cells may be arranged in horizontal NAND strings on a substrate. See FIG. 9, for example.

The memory cells can be programmed to have a threshold voltage (Vth) which corresponds to a data state. See FIG. 11C, for example. The Vth is a function of an amount of charge stored in a charge storing material of the memory cell. A read operation can then be performed to determine the Vth and therefore the data state of a memory cell.

A program operation can use one or more program passes to program the Vth of the memory cells to levels which represent the different data states. Each program pass can involve applying a program voltage signal with multiple program pulses to a selected word line, such as depicted in FIGS. 12, 13A, 13D, 14A and 14B. In one approach, each program pulse is followed by one or more verify voltages to determine whether the memory cells have reached an assigned Vth. However, the verify tests consume time in the program operation. Reducing the program time is important, particularly when the program operation involves multiple passes. Multiple program passes typically achieve narrower Vth distributions and reduce disturbs. On the other hand, accurately programming the memory cells to their assigned Vth is important to ensure that the data can be read back without excessive read errors.

Figure 3:
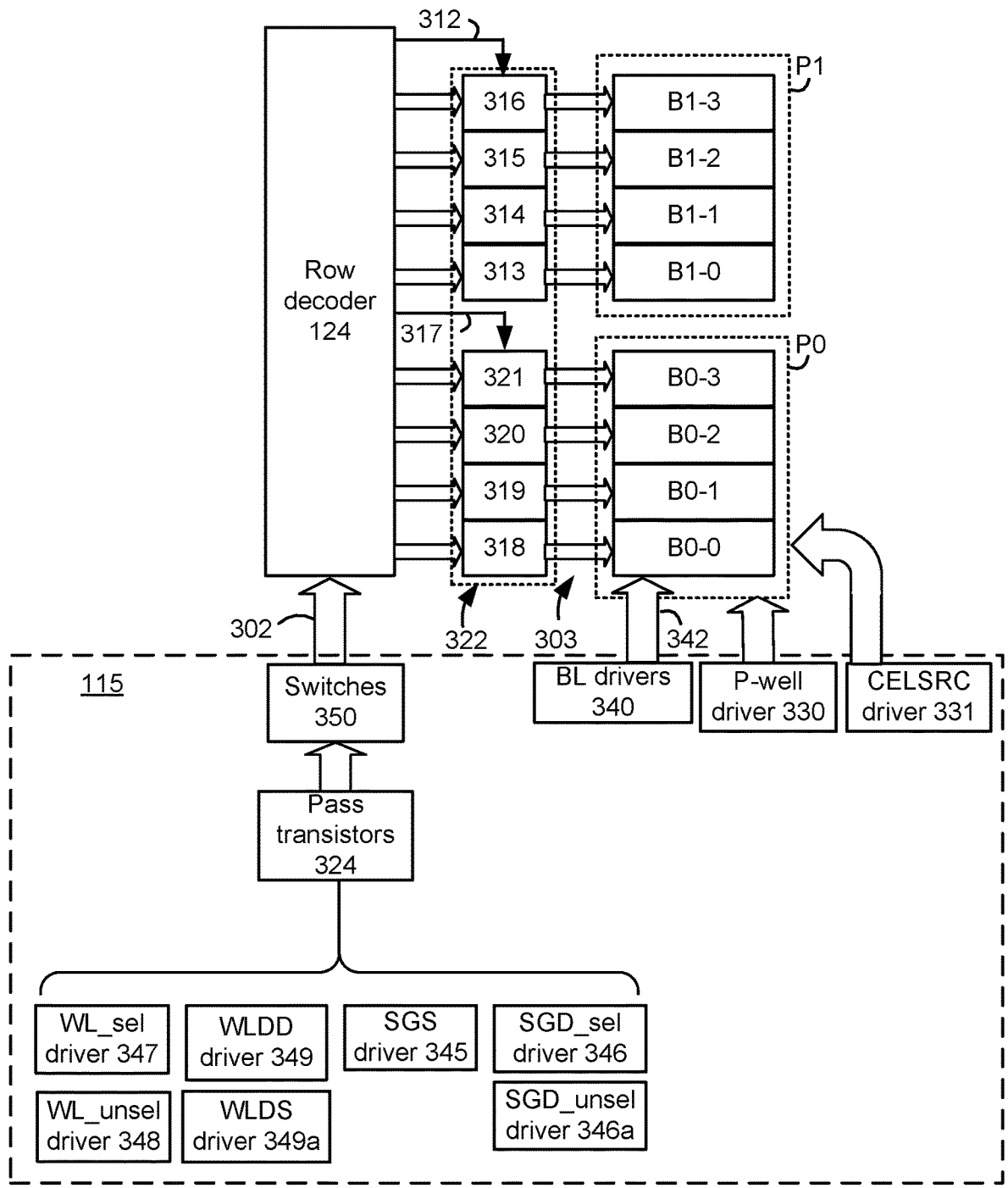
FIG. 3 depicts an example implementation of the power control circuit 115 of FIG. 1A for providing voltages to blocks of memory cells.

Techniques provided herein address the above and other issues. In one aspect, a program operation is provided in which groups of memory cells are programmed to respective checkpoint states in a first program pass. For example, see FIGS. 11A and 16A with checkpoint states CP1-CP4. Each checkpoint state is associated with a set of data states such as depicted in FIGS. 10B2 and 10B3. A checkpoint state is a state to which a memory cell is programmed before being programmed to its assigned data state. For example, in FIG. 10B2, CP1-CP4 are associated with data states S1-S4, S5-S7, S8-S10 and S11-S15, respectively. In FIG. 10B3, CP1-CP4 are associated with data states S1-S5, S6-S9, S10-S12 and S13-S15, respectively. In the first program pass, verify voltages (Vcp1-Vcp4, Vcp1a-Vcp4a) are used in verify tests for the checkpoint states. The Vth of the memory cells is temporarily provided in the checkpoint state before they memory cells are programmed to their assigned data state in the second and third program passes, for instance.

In a second program pass of the program operation, the memory cells are programmed closer to their assigned data state by applying program pulses to the selected word line but without performing verify tests. For example, see FIGS. 11B and 16B. Each memory cell is programmed with a specified number of program pulses based on its assigned data state. A bit line voltage associated with the memory cell can also be controlled during each program pulse to fine tune the increase in Vth which the memory cell experiences in the second program pass. See, e.g., FIGS. 13B, 13C and 13E.

In a third program pass of the program operation, the memory cells are programmed to their assigned data state by applying program pulses and performing verify tests. For example, see FIGS. 11C and 16C.

The number of checkpoint states and the number of data states associated with each checkpoint state can be optimized. In one approach, the number of data states associated with each checkpoint state is a function of a spacing between the verify voltages of the data states. The verify voltages of the data states can be set based on tests and experiments to minimize the likelihood of read errors and to keep the Vth levels within an allowable range. In some cases, the verify voltages are different for different selected word lines. Moreover, the spacing between the verify voltages of the data states may be non-uniform. For example, factors such as program or read disturb can cause an upshift in the Vth of memory cells, particularly memory cells in lower data states, while factors such as data retention loss can cause a downshift in the Vth of memory cells, particularly memory cells in higher data states. FIG. 11C provides an example in which the minimum spacing (d1, d3) between the verify voltages is relatively large for the lowest and highest sets of data states, compared to the minimum spacing (d2) of the mid-range sets of data states. FIG. 16C provides an example in which the minimum spacing (d4) between the verify voltages is relatively large for the lowest set of data states, and the minimum spacing is progressively smaller for progressively higher sets of data states.

In one approach, the number of data states associated with each checkpoint state is an increasing function of a minimum spacing between the verify voltages of the data states. That is, the number of data states is greater when the minimum spacing is greater. The number of checkpoint states, and the number of data states associated with each checkpoint state, can also vary as a function of a position of the selected word line in a block. For example, variations can be based on whether a selected word line is a boundary word line, e.g., a top or bottom word line of a block, or an interface-adjacent word line in the case of a multi-tier block, or whether a selected word line is at the widest point of a memory hole (see FIGS. 7A and 7B).

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, and a storage region for sets of checkpoint voltages and data states 116. A storage region 113 may also be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The storage region for sets of checkpoint voltages and data states 116 can be used in a program operation as discussed herein. See, e.g., FIG. 10B1 to 10B3 for examples.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, storage region for sets of checkpoint voltages and data states 116, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material (PCM), and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. For example, see FIG. 5A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein in accordance with the flowcharts of FIGS. 10A and 10C to 10E.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 8, each bit line is connected to four NAND strings, —one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four data latches, e.g., comprising individual latches LP, LMP, UMP and UP, can be provided for each sense circuit. In a four bit per cell embodiment, LP stores a bit for a lower page of data, LMP stores a bit for a lower-middle page of data, UMP stores a bit for an upper-middle page of data, and UP stores a bit for an upper page of data. See also FIG. 19. In some cases, a different number of data latches may be used. For example, a fifth latch PS can be used to store a bit indicating whether a memory cell is subject to a partial speed programming as described further below.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 8:
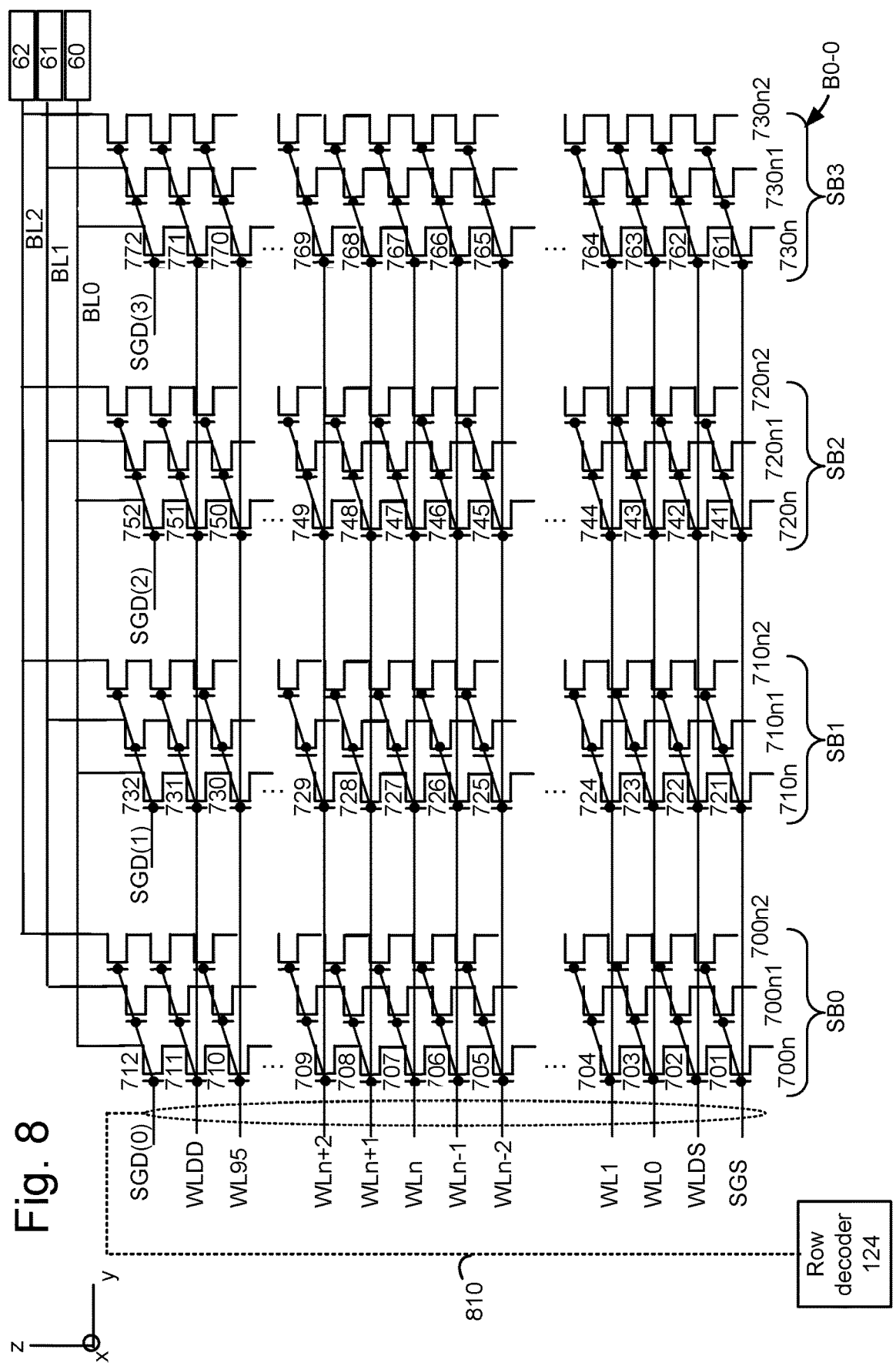
FIG. 8 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_unsel driver 348 provides a voltage signal on unselected data word lines The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5A. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5A.

Bit line voltage drivers 340 include voltage sources which provide voltages to the bit lines 342. The bit line voltage for sensing can be 0.5 V, for example.

Figure 4:
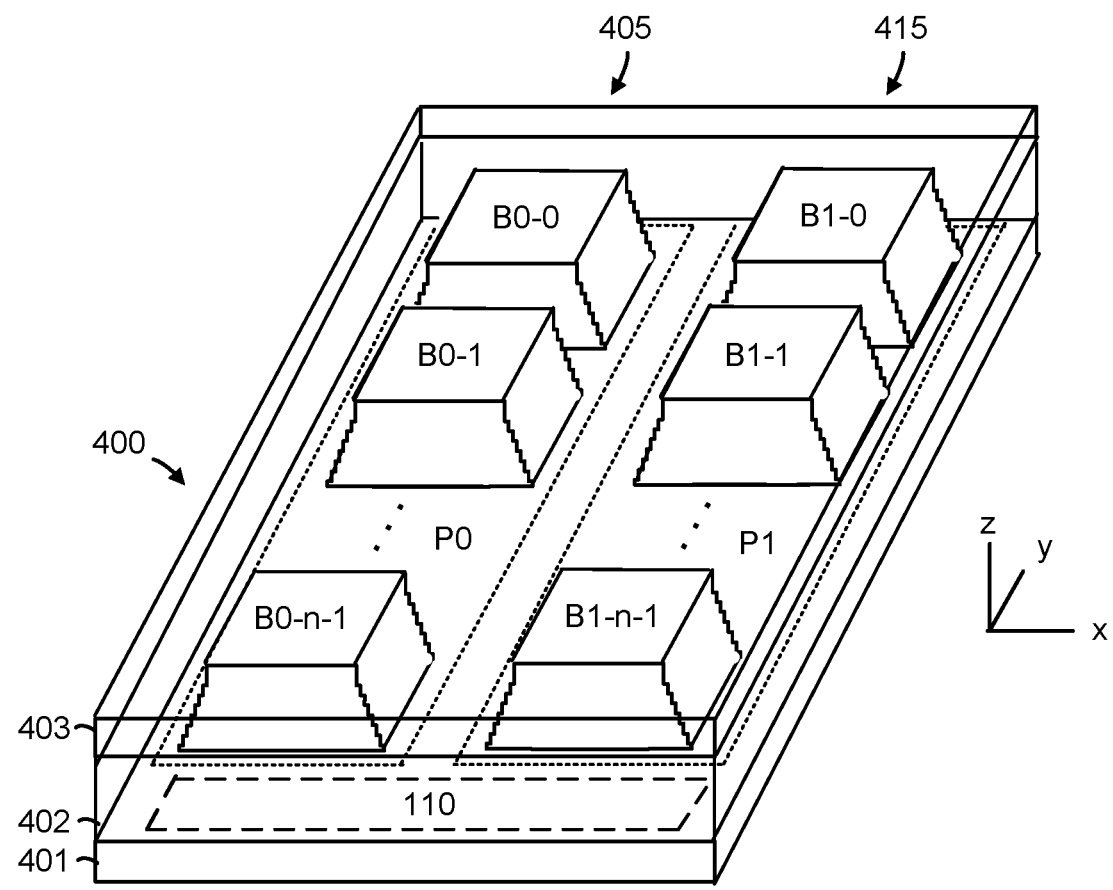
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5A:
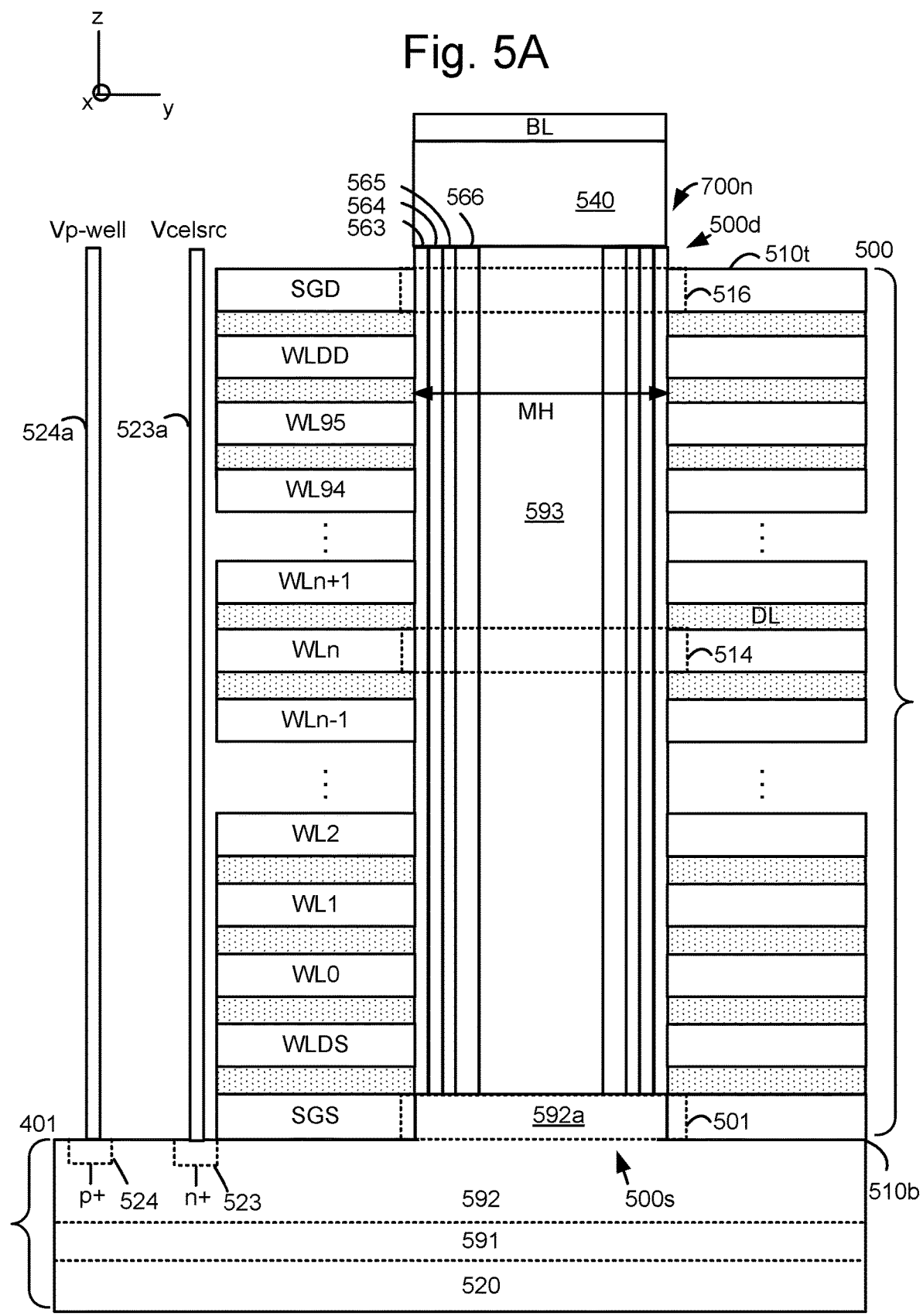
FIG. 5A depicts an example cross-sectional view of a portion of the block B0-0 of FIG. 4, including a NAND string 700*n*.

The memory cells can be formed in vertical NAND strings in the blocks, consistent with FIG. 5A. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate, consistent with FIG. 9.

Figure 7A:
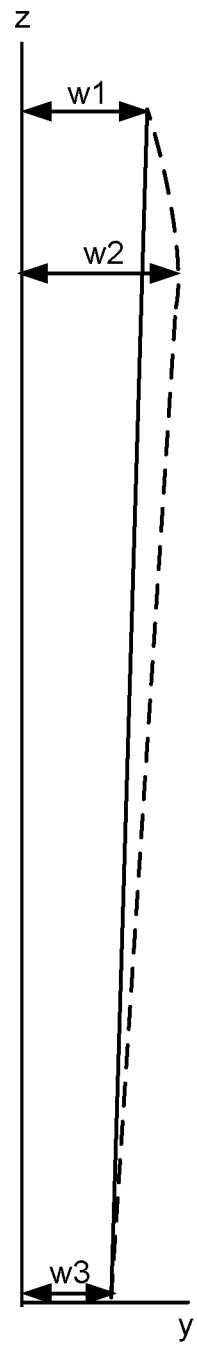
FIG. 7A depicts example plots of memory hole width versus height in the NAND string 700*n* of FIG. 5A.

FIG. 5A depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . WLn−1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 5B). The memory holes can have a varying width such as depicted in FIG. 7A.

The stack is depicted as comprising one tier but can optionally include one or more tiers of alternating conductive and dielectric layers. For example, see a stack comprising a bottom tier (BT) and a top tier (TT) in FIG. 6. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient.

WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride ($Si_3N_4$) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 (see also FIG. 3) connected to the source ends of the NAND strings. The p-well region may comprise an epitaxial region 592a which extends upward adjacent to the SGS layer. The p-well region can include an n+contact 523 connected to a local interconnect 523a (a conductive path or source line) for receiving Vcelsrc, and a p+contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 5B:
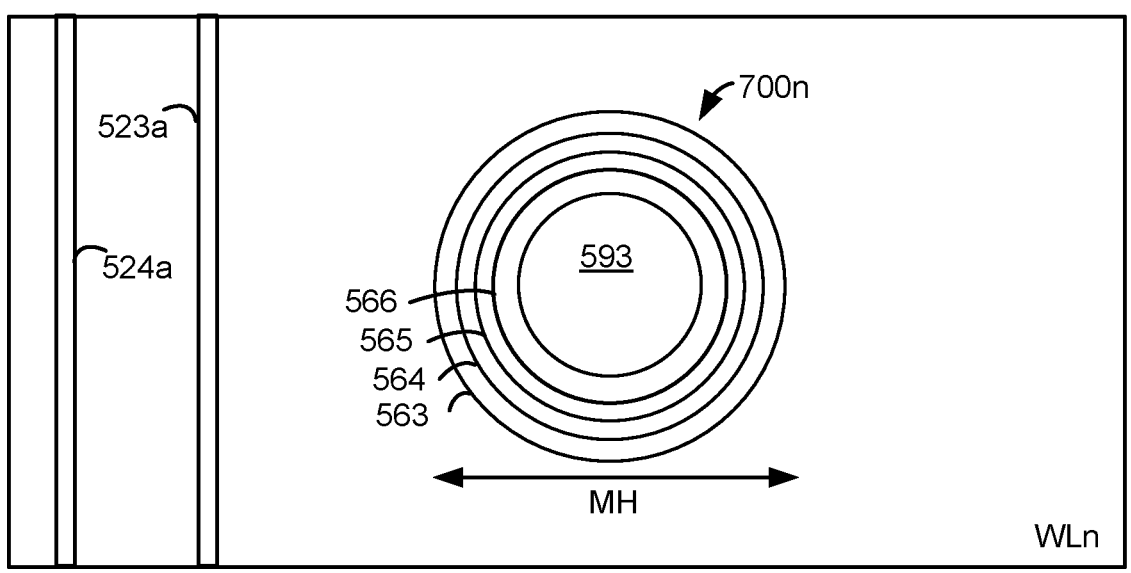
FIG. 5B depicts an example cross-sectional view of the block portion of FIG. 5A in the x-y plane at the level of WLn.

FIG. 5B depicts an example cross-sectional view of the block portion of FIG. 5A in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 6:
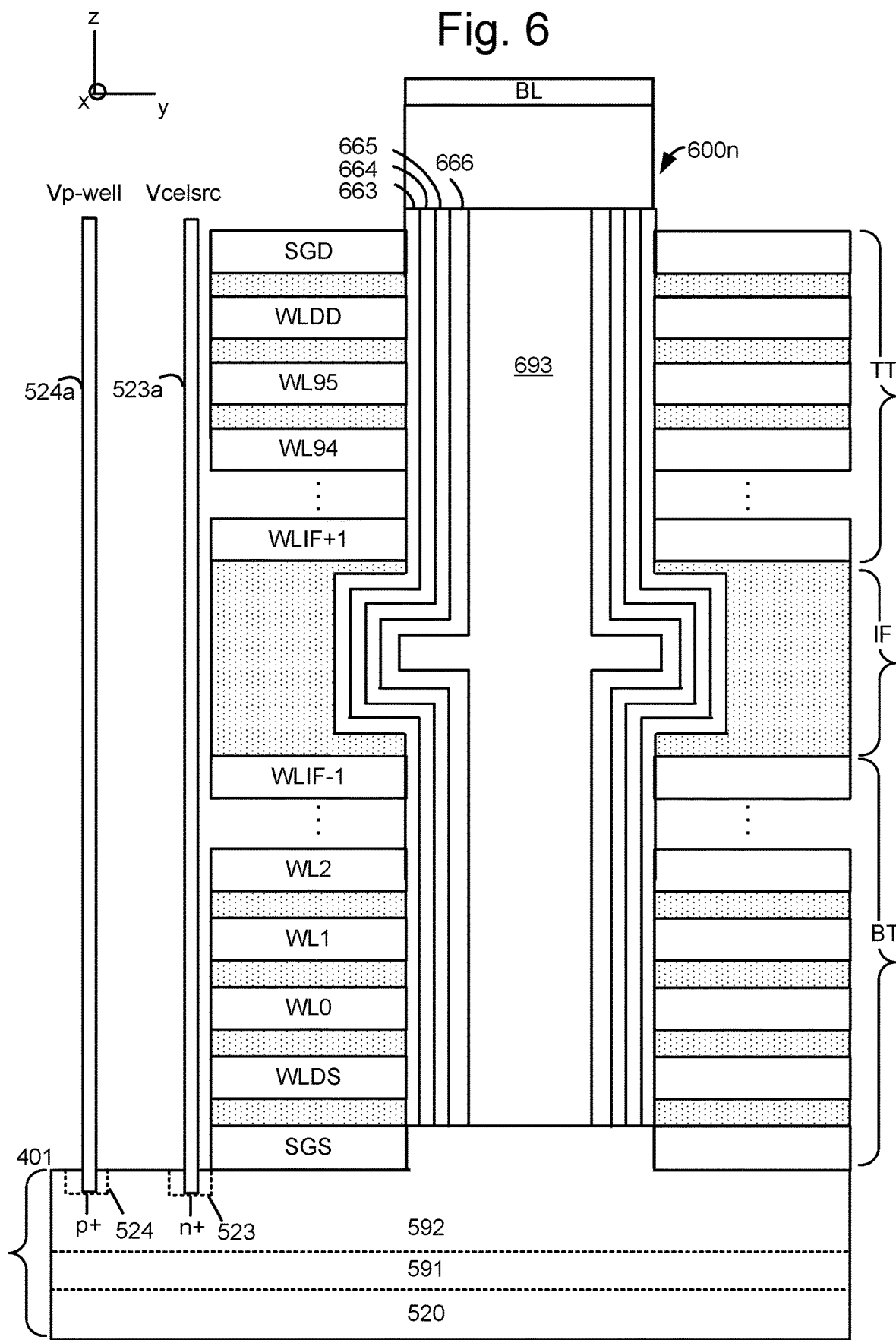
FIG. 6 depicts another example cross-sectional view of a portion of the block B0-0 of FIG. 4, including a NAND string 600*n*, where the block comprises two tiers.
Figure 7B:
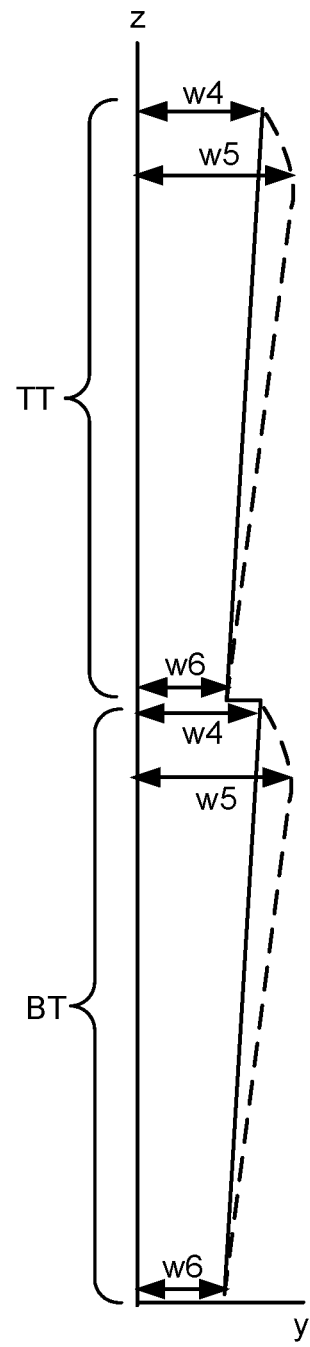
FIG. 7B depicts example plots of memory hole width versus height in the NAND string 600*n* of FIG. 6.

FIG. 6 depicts another example cross-sectional view of a portion of the block B0-0 of FIG. 4, including a NAND string 600n, where the block comprises two tiers. Like-numbered elements correspond to those in FIG. 5A. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. The memory holes can have a varying width such as depicted in FIG. 7B. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 in the BT, and WLIF+1 to WL95 in the TT, where WLIF−1 is the word line adjacent to and below the IF, and WLIF+1 is the word line adjacent to and above the IF. For example, when the bottom tier comprises WL0-WL47 and the top tier comprises WL48-WL95, WLIF−1=WL47 and WLIF+1-WL48. Optionally, the word lines adjacent to the IF are allocated as dummy word lines.

Additionally, the height of the IF is greater than the height of the remaining dielectric layers between the word lines. As a result, there is a reduced conductivity in the interface so it is more difficult for the electrons to move through the interface. This configuration can make the memory cells in the top or bottom tier more susceptible to read disturb. In some cases, the position of a memory cell (e.g., the position of a selected word line) within a tier affects the risk of a disturb.

FIG. 7A depicts example plots of memory hole width versus height in the NAND string 700n of FIG. 5A. The width of a memory hole can vary in the vertical direction due to variations in the etching process. The solid line depicts an example in which the width is progressively greater higher in the memory hole, starting from a width w3 at the bottom of the memory hole and ending at a width w1 at a top of the memory hole. The dashed line depicts an example in which the width is progressively greater higher in the memory hole, starting from the width w3 at the bottom of the memory hole until a width w2 is reached partway along the memory hole. The width then decreases to w1 at the top of the memory hole. This is an example of bowing, which results in an enlargement of the memory hole diameter at a mid-range region of the hole, between the top and bottom. Other examples of abnormal profiles include striation (a vertical scratch on the sidewall), distortion and twisting. For each selected word line, there will be an associated memory hole width which can affect the optimum number and position of checkpoints.

FIG. 7B depicts example plots of memory hole width versus height in the NAND string 600n of FIG. 6. The memory hole width for each tier is similar to the profile depicted in FIG. 7A. For the bottom tier (BT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the memory hole until a width w5 is reached partway along the bottom tier. The width then decreases to w4 at the top of the bottom tier.

For the top tier (TT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the tier until a width w5 is reached partway along the top tier. The width then decreases to w4 at the top of the top tier.

Since the word lines are at different heights along the memory hole, for each selected word line, there will be an associated memory hole width which can affect the optimum number and position of checkpoints.

FIG. 8 depicts an example view of the block B0-0 of FIG. 4, with respective NAND strings arranged in sub-blocks, along with associated bit lines and sense circuits. The NAND strings are arranged in sub-blocks of the block in a 3D configuration. The block is consistent with FIG. 5A to 6. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In one option, the optimum number and position of checkpoints can be a function of the position of the selected sub-block in the block and/or the order in which the sub-blocks are programmed. For example, memory cells in SB0 may be more susceptible to program disturb when the program order for a selected word line involves SB0 first followed by SB1, then SB2 and finally SB3. In this case, after being programmed, the memory cells in SB0 are inhibited from programming during the programming of three other sub-blocks. Each time the memory cell in SB0 are inhibited from programming, program disturb can occur. The lower data states are most susceptible to program disturb. To accommodate this increased risk of disturb, the verify voltages for word lines in SB0 can be adjusted to provide a greater spacing for the lower states. This in turn could result in a larger number of data states being associated with the lowest checkpoint state, CP1, for instance.

Different sub-blocks can also have different susceptibilities to program or read disturbs due to other factors such as different distances from the row decoder and the corresponding different RC delays of a word line voltage signal.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

FIG. 9 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 900 includes a p-well 903 within an n-well 902, which in turn is in a p substrate 901. Vp-well and Vcelsrc are provided to the p-well via contacts 910 and 911, respectively. A NAND string 919 is arranged on the substrate and include select gate transistors and memory cells. For example, the NAND string includes a SGS transistor 920, memory cells 921, 922 and 923 connected to WLDS, WL0 and WL1, respectively, memory cells 924, 925 and 926 connected to WLn-1, WLn and WLn+1, respectively, memory cells 927 and 928 connected to WL95 and WLDD, respectively, and a SGD transistor 929. Doped regions in the substrate, such as example doped regions 911-917, act as sources and drains of the transistors. Vbl is provided to the doped region 917. When appropriate voltages are provided to the NAND string, an inversion layer or channel 940 is formed in the p-well. A remaining portion 903a of the p-well is biased at Vp-well.

The example memory cell 924 comprises a tunneling layer 930, a floating gate layer 931, a blocking oxide layer 932 and a control gate 933.

FIG. 10A depicts a flowchart of an example program operation which optimizes the number and configuration of checkpoint states. The program operation can be performed on a set of memory cells connected to a word line or other control line. In an example implementation, the memory cells are arranged in respective NAND strings and are non-volatile memory cells which are programmed by gradually increasing the amount of charge in a charge storage region. The charge storage region can be a charge trapping layer or a floating gate, for example, such as discussed in connection with FIG. 5A to 9. However, other types of memory cells which are capable of storing data in multiple data states, e.g., eight, sixteen or more data states, could potentially be used. For example, multi-bit MRAM memory cells are being developed which can store data in eight or more data states according to different magnetic configurations of the memory cell. One example uses spin-transfer-torque random access memory (STT-RAM). Other multi-bit technologies being developed include multi-bit PCM, ReRAM and FeRAM.

As mentioned at the outset, a program operation can be optimized by optimizing the number and configuration of checkpoint states. Step 1000 begins a program operation for a selected word line, WLn. Step 1001 includes selecting checkpoint states, where each checkpoint state is associated with a set of assigned data states. See FIGS. 10B2 and 10B3, for example, where checkpoint states CP1-CP4 are associated with set(1)-set(4) and set(la)-set(4a), respectively, of data states. Set(1)-set(4) comprise data states S1-S4, S5-S7, S8-S10 and S11-S15, respectively, for groups of memory cells GRP1-GRP4, respectively, consistent with FIG. 15. Set(la)-set(4a) comprise data states S1-S5, S6-S9, S10-S12 and S13-S15, respectively, for groups of memory cells GRP1a-GRP4a, respectively, consistent with FIG. 17.

CP1-CP4 can therefore be associated with set(1)-set(4) and data states S1-S4, S5-S7, S8-S10 and S11-S15, or with set(la)-set(4a) and data states S1-S5, S6-S9, S10-S12 and S13-S15, respectively.

Also in step 1001, a number of assigned data states in each set is a function of a minimum spacing between verify voltages of the data states of the set. For example, as depicted in FIG. 10B2, for set(1)-set(4), a minimum spacing is medium (d1), low (d2), low (d2) or high (d3) and the number of assigned data states is 4, 3, 3 and 5, respectively. In another example, depicted in FIG. 10B3, for set(la)-set (4a), a minimum spacing is high (d4), medium (d5), low (d6) or low (d7) and the number of assigned data states is 5, 4, 3 and 3, respectively. The number of states is higher when the minimum spacing is higher, in one approach, such that the number of states is an increasing function of the minimum spacing.

Step 1002 includes storing data in latches associated with the memory cells to identify their assigned data state. For example, see FIG. 19. As depicted in FIG. 2, a set of latches 194-197 can be connected to each NAND string.

Step 1003 includes performing a first program pass with verify tests to checkpoint states. For example, see the examples of FIGS. 11A and 16A, where the verify tests use the verify voltages Vcp1-Vcp4 and Vcp1a-Vcp4a, respectively. Step 1004 includes performing a second, foggy program pass without verify tests from the checkpoint states to foggy states associated with the assigned states. For example, see the examples of FIGS. 11B and 16B. Step 1005 includes performing a third, fine program pass with verify tests from the foggy states to the assigned data states. For example, see the examples of FIGS. 11C and 16C, where the verify tests use the verify voltages VS1-VS15 and VS1a-VS15, respectively. Three program passes are depicted as an example only. Detailed examples of the program passes, including voltage signals and Vth distributions of the memory cells, are provided further below.

FIG. 10B1 depicts an example of sets of checkpoint voltages and data states 116, consistent with FIG. 1A and FIG. 10A at step 1001. The example depicts sets 116a and 116b, shown in further detail in FIGS. 10B2 and 10B3, respectively. A plurality of sets can be provided for use by a control circuit in a program operation. Based on factors such as the position of the selected word line, the memory hole width at the height of the selected word line, and the position of the selected sub-block, one of the sets can be selected for use in the program operation. The selected set identifies the checkpoint states and the associated data states.

In FIGS. 10B2 and 10B3, the table includes columns indicating a memory cell group (MC grp.), a checkpoint state (CP) and associated verify voltages (Vverify), an identifier of a set of data states (DS set), the data states and associated verify voltages, a minimum spacing between the verify voltages of the set, and a number of data states in the set.

FIG. 10B2 depicts a table with an example of the set of checkpoint voltages and data states 116a of FIG. 10B1. In this example, groups of memory cells GRP1-GRP4 are associated with checkpoint states CP1-CP4, respectively, CP verify voltages Vcp1-Vcp4, respectively, data states S1-S4, S5-S7, S8-S10 and S11-S15, respectively, data state verify voltages VS1-VS5, VS5-VS7, VS8-VS10 and VS11-VS15, respectively, minimum spacings d1, d2, d2 and d3, respectively, and 4, 3, 3 and 5 data states, respectively. See FIG. 11A for examples of Vcp1-Vcp4 and FIG. 11C for examples of d1-d3.

FIG. 10B3 depicts a table with an example of the set of checkpoint voltages and data states 116b of FIG. 10B1. Groups of memory cells GRP1-GRP4 are associated with checkpoint states CP1-CP4, respectively, CP verify voltages Vcp1a-Vcp4a, respectively, data states S1-S5, S6-S9, S10-S12 and S13-S15, respectively, data state verify voltages VS1a-VS5a, VS6a-VS9a, VS10a-VS12a and VS13a-VS15a, respectively, minimum spacings d4-d7, respectively, and 5, 4, 3 and 3 data states, respectively. See FIG. 16A for examples of Vcp1a-Vcp4a and FIG. 16C for examples of d4-d7.

Figure 10C:
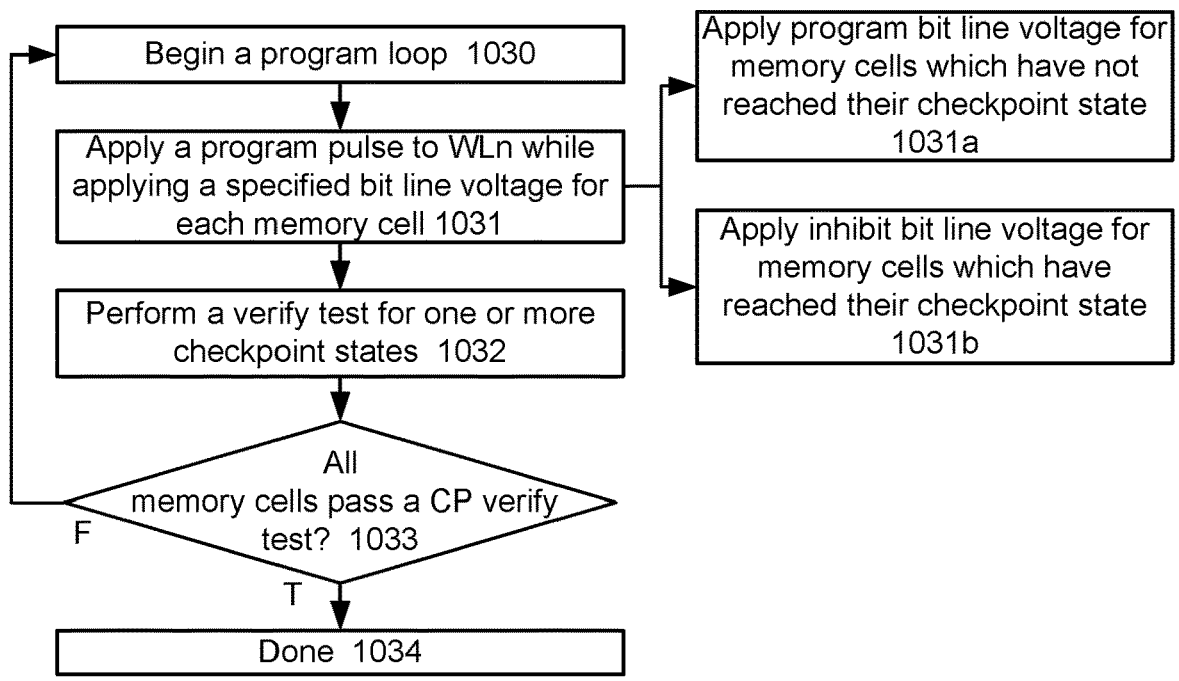
FIG. 10C depicts a flowchart of an example first program pass consistent with FIG. 10A, step 1003.

FIG. 10C depicts a flowchart of an example first program pass consistent with FIG. 10A, step 1003. Step 1030 begins a program loop. Each program loop is a program-verify iteration since it comprises a program voltage followed by and one or more verify voltages. Step 1031 includes applying a program pulse to WLn while applying a specified bit line voltage for each memory cell. See, e.g., the program pulses in FIG. 12. Each memory cell connected to WLn may be in a respective NAND string which is connected to a respective bit line, such a depicted in FIG. 8. Step 1031 can include steps 1031a and 1031b. Step 1031a includes applying a program bit line voltage for memory cells which have not reached their checkpoint state. A program bit line voltage may be 0 V, for example, to allow a full speed programming of the memory cell. Step 1031b includes applying an inhibit bit line voltage for memory cells which have reached their checkpoint state. An inhibit bit line voltage may be 1.5-2 V, for example, to inhibit programming of the memory cell.

Step 1032 includes performing a verify test for one or more checkpoint states. For example, a verify test for the CP1 state can be performed by applying Vcp1 to the selected word line and sensing the memory cells which are assigned to the associated data states of the checkpoint (according to their latch data) to determine whether they are in a non-conductive state. A memory cell in a non-conductive state has a Vth>Vcp and can be inhibited from further programming in the program pass.

A decision step 1033 determines whether all (or nearly all) of the memory cells pass their associated checkpoint (CP) verify test, for each group of memory cells. If the decision step 1033 is true (T), the program pass is done at step 1034. If the decision step 1033 is false (F), another program loop is started at step 1030.

Figure 10D:
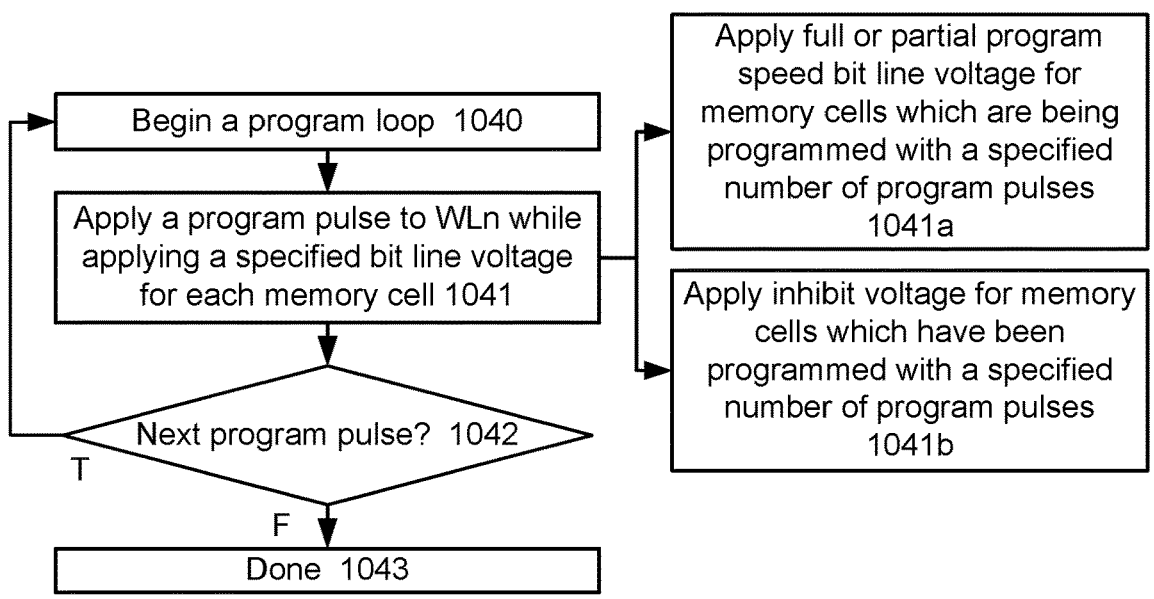
FIG. 10D depicts a flowchart of an example second program pass consistent with FIG. 10A, step 1004.

FIG. 10D depicts a flowchart of an example second program pass consistent with FIG. 10A, step 1004. Step 1040 begins a program loop. Step 1041 includes applying a program pulse to WLn while applying a specified bit line voltage for each memory cell. See, e.g., FIG. 13A or 13D. Step 1041 can include steps 1041a and 1041b. Step 1041a includes applying a full or partial program speed bit line voltage for memory cells which are being programmed with a specified number of program pulses. For example, see FIGS. 13B, 13C and 13E. A full program speed bit line voltage may be 0 V and a partial program speed bit line voltage may be 0.5 V. Step 1041b includes applying an inhibit bit line voltage for memory cells which have been programmed with a specified number of program pulses.

A decision step 1042 determines whether a next program pulse is to be applied to WLn in the program pass. A next program pulse may be applied when the memory cells have not yet all been programmed with a specified number of program pulses. If the decision step 1042 is true, a next program loop begins at step 1040. If the decision step 1042 is false, the program pass is done at step 1043.

Figure 10E:
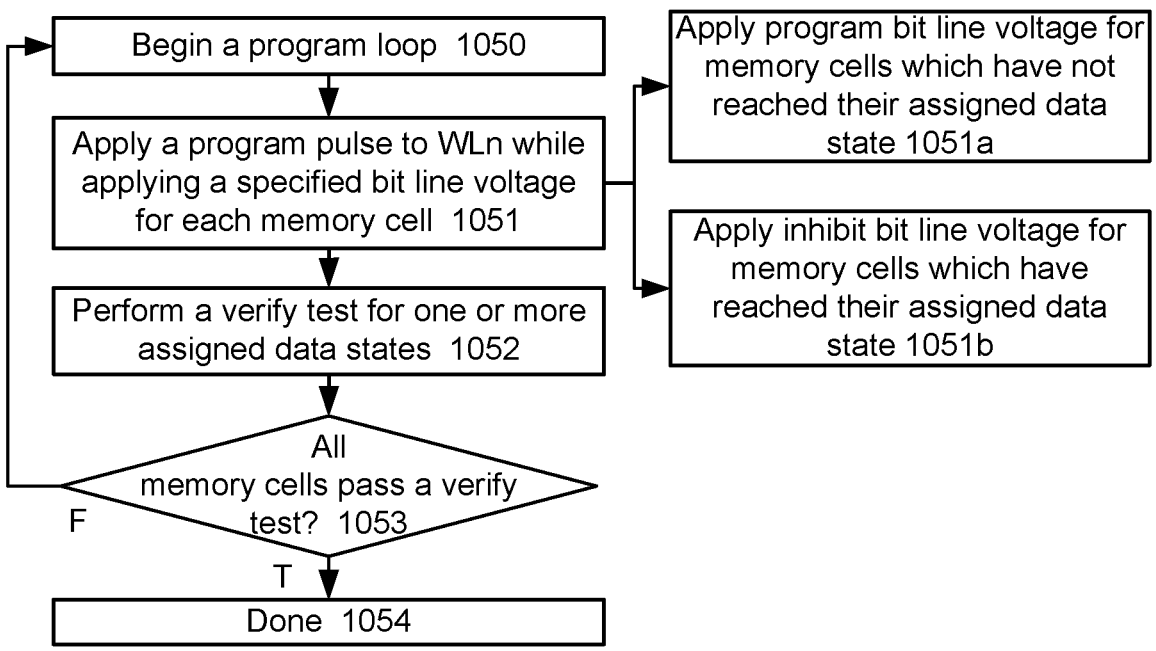
FIG. 10E depicts a flowchart of an example third program pass consistent with FIG. 10A, step 1005.

FIG. 10E depicts a flowchart of an example third program pass consistent with FIG. 10A, step 1005. Step 1050 begins a program loop. Each program loop is a program-verify iteration. Step 1051 includes applying a program pulse to WLn while applying a specified bit line voltage for each memory cell. See, e.g., FIGS. 14A and 14B. Step 1051 can include steps 1051a and 1051b. Step 1051a includes applying a program bit line voltage for memory cells which have not reached their assigned data state. A memory cell has not reached its assigned data state when the Vth of the memory is below the verify voltage of the assigned data state. For example, a memory cell assigned to the S15 data state has not reached its assigned data state when the Vth of the memory is below VS15 or VS15a in FIGS. 11C and 16C, respectively. Step 1051*b* includes applying an inhibit bit line voltage for memory cells which have reached their assigned data state.

Step 1052 includes performing a verify test for one of more assigned data states. This can involve the verify voltages VS1-VS15 of FIG. 11C or VS1*a*-VS15*a* of FIG. 16C, for example.

A decision step 1053 determines whether all (or nearly all) of the memory cells which are being programmed in the program pass have passed a verify test, that is, have been programmed to their assigned data state. The memory cells assigned to the erased data state are typically not programmed. If the decision step 1053 is false, a next program loop begins at step 1050. If the decision step 1053 is true, the program pass is done at step 1054.

In FIGS. 11A-11E and 16A-16C, the vertical axis depicts a number of memory cells on a logarithmic scale and the horizontal axis depicts a threshold voltage on a linear scale. The Vth distributions can represent memory cells connected to a selected word line, for example.

FIG. 11A depicts threshold voltage distributions after a first program pass in a first example program operation, consistent with FIG. 10C, where verify tests are performed using checkpoint voltages Vcp1-Vcp4. After erasing the memory cells, the Vth distribution 1100 is obtained, representing the erased state.

The memory cells are then subject to the first program pass of the program operation. The memory cells which have an assigned data state other than the erased state are programmed to an associated checkpoint state. For example, memory cells assigned to the S1-S4, S5-S7, S8-S10 and S11-S15 data states are programmed to the CP1-CP4 states using the verify voltages Vcp1-Vcp4, respectively. The CP1-CP4 states are represented by the Vth distributions 1110, 1120, 1130 and 1140, respectively. The memory cells assigned to the erased state are not programmed. The other data states, e.g., S1-S15 are referred to as programmed data states. There are sixteen data states in this example. The techniques described herein are particular suitable when there is relatively large number of data states, such as sixteen or thirty-two data states.

Figure 12:
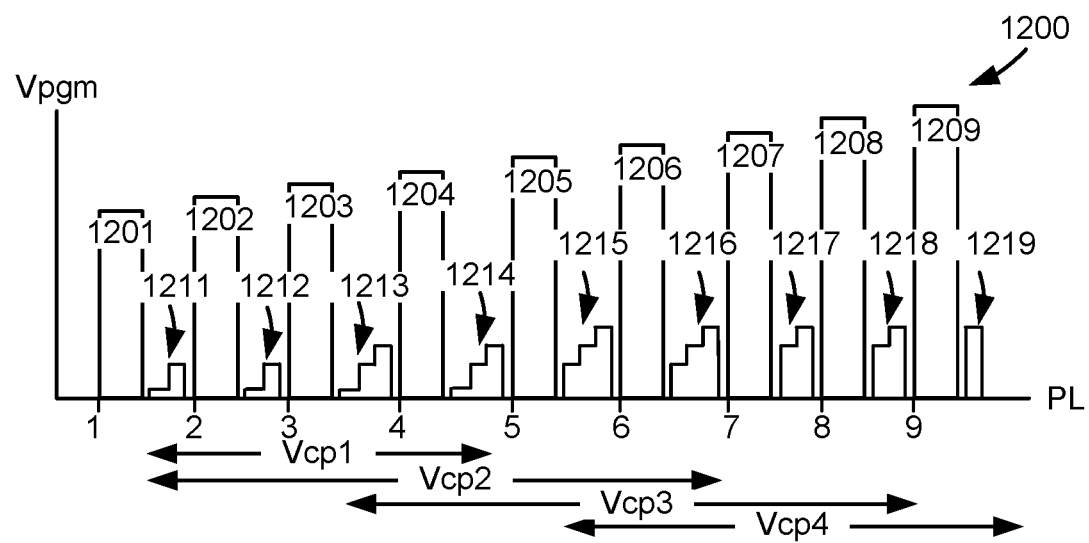
FIG. 12 depicts an example of a program-verify voltage signal in a first program pass which provides the threshold voltage distributions of FIG. 11A.

In one approach, the first program pass uses the voltage signal of FIG. 12.

The first program pass consumes a relatively small amount of time since the memory cells are programmed to a relatively small number of checkpoint states, in comparison to the number of programmed data states.

FIG. 11B depicts threshold voltage distributions after a second program pass in a first example program operation, consistent with FIG. 10D. The second program pass programs memory cells from the checkpoint states to foggy states of the assigned data states. The arrows represent increases in Vth for memory cells of different assigned data states. For example, the memory cells assigned to the S1-S4 data states are programmed from the CP1 state to S1*f*-S4*f* states (f denotes foggy), respectively, as represented by the Vth distributions 1111-1114, respectively. The memory cells assigned to the S5-S7 data states are programmed from the CP2 state to S5*f*-S7*f* states, respectively, as represented by the Vth distributions 1121-1123, respectively. The memory cells assigned to the S8-S10 data states are programmed from the CP3 state to S8*f*-S10*f* states, respectively, as represented by the Vth distributions 1131-1133, respectively. The memory cells assigned to the S11-S15 data states are programmed from the CP4 state to S11*f*-S15*f* states, respectively, as represented by the Vth distributions 1141-1145, respectively.

A foggy state refers to a Vth distribution of a data state which is wider than the final Vth distribution which is achieved after the third, fine program pass. The foggy state Vth distribution will typically have a portion which exceeds the verify voltage of the data state and a portion which falls below the verify voltage of the data state. For example, the foggy state Vth distribution 1145 has a portion which exceeds VS15 and a lower tail portion which falls below VS15.

The foggy state of some memory cells is relatively close to the Vth of the associated checkpoint state so that these memory cells undergo a relatively small amount of programming in the program pass. For example, the foggy state of the memory cells assigned to S1 is relatively close to the Vth of CP1. These memory cells may be programmed using only one or two program pulses, for example. On the other hand, the foggy state of other memory cells is relatively far from the Vth of the associated checkpoint state so that these memory cells undergo a relatively large amount of programming in the program pass. For example, the foggy state of the memory cells assigned to the S4 data state is relatively far from the Vth of CP1. These memory cells may be programmed using four or five program pulses, for example. The Vth increase is progressively larger for the memory cells assigned to the S1-S4 data states, respectively.

The second program pass consumes a relatively small amount of time since it does not perform verify tests, in comparison to a program pass which performs verify tests.

FIG. 11C depicts threshold voltage distributions after a third program pass in a first example program operation, consistent with FIG. 10E, where verify tests are performed using verify voltages VS1-VS15. The third and final program pass is a fine program pass because the memory cells are programmed a relatively small amount to fine tune their Vth. The Vth distribution is narrowed by increasing the lower tail of the foggy state distribution above the verify voltage. Specifically, the memory cells assigned to the S1-S15 data states are programmed from the S1*f*-S15*f* foggy states to the S1-S15 data states as represented by the Vth distributions 1151-1154, 1161-1163, 1171-1173 and 1181-1185. The memory cells assigned to the S1-S4 data states are subject to a verify test using the verify voltages VS1-VS4, respectively, the memory cells assigned to the S5-S7 data states are subject to a verify test using the verify voltages VS5-VS7, respectively, the memory cells assigned to the S8-S10 data states are subject to a verify test using the verify voltages VS8-VS10, respectively, and the memory cells assigned to the S11-S15 data states are subject to a verify test using the verify voltages VS11-VS15, respectively. The memory cells are programmed until their Vth exceeds the verify voltage of their assigned data state.

The different groups of memory cells associated with CP1-CP4 are programmed to respective sets of data states, one group per set of data states, including set(1)-set(4), respectively.

The verify voltages are separated by a spacing or distance. In this example, the verify voltages of set(1)-set(4) are separated by spacings d1, d2, d2 and d3, respectively. The spacing is uniform within each set in this example. In other examples, the spacing varies within each set. The minimum spacing in each set is relevant since read errors are most likely when the spacing is a minimum. The third program pass consumes a relatively small amount of time since the increase in Vth of the memory cells is relatively small.

FIG. 11D depicts threshold voltage distributions in a variation of FIG. 11A, where an offset voltage (Vcp1L-Vcp4L) is used to trigger partial speed programming. In this option, the memory cells are sensed at an offset voltage as well as at the checkpoint voltage, during the programming to the checkpoint states. The offset voltage is below the checkpoint voltage by a specified amount. When a memory cell being programmed to CP1 is sensed as having a Vcp1>Vth>Vcp1L (as represented by the Vth distribution 1110a), its bit line voltage is set to a positive voltage such as 0.5 V during the next program pulse to provide partial speed programming. This can help narrow the Vth distribution of the CP1 state by increasing the Vth at a slower rate. When a memory cell being programmed to CP1 is sensed as having a Vth>Vcp1 (as represented by the Vth distribution 1110b), it has completed programming to CP1 and its bit line voltage is set to an inhibit level, e.g., 1.5-2 V, during the next program pulse.

Similarly, when a memory cell being programmed to CP2 is sensed as having a Vcp2>Vth>Vcp2L (as represented by the Vth distribution 1120a), its bit line voltage is set to provide partial speed programming during the next program pulse. When a memory cell being programmed to CP2 is sensed as having a Vth>Vcp2 (as represented by the Vth distribution 1120b), it has completed programming to CP2 and its bit line voltage is set to an inhibit level during the next program pulse.

When a memory cell being programmed to CP3 is sensed as having a Vcp3>Vth>Vcp3L (as represented by the Vth distribution 1130a), its bit line voltage is set to provide partial speed programming during the next program pulse. When a memory cell being programmed to CP3 is sensed as having a Vth>Vcp3 (as represented by the Vth distribution 1130b), it has completed programming to CP3 and its bit line voltage is set to an inhibit level during the next program pulse.

When a memory cell being programmed to CP4 is sensed as having a Vcp4>Vth>Vcp4L (as represented by the Vth distribution 1140a), its bit line voltage is set to provide partial speed programming during the next program pulse. When a memory cell being programmed to CP4 is sensed as having a Vth>Vcp4 (as represented by the Vth distribution 1140b), it has completed programming to CP4 and its bit line voltage is set to an inhibit level during the next program pulse.

FIG. 11E depicts threshold voltage distributions in a variation of FIG. 11A, where verify voltages VS1, VS5, VS8 and VS11 are used to distinguish lower and upper tail memory cells to guide the second program pass. This option can be used separately or with the option of FIG. 11D. After the memory cells have been programmed to the checkpoint states, e.g., at the end of the first program pass, sensing operations can be performed while the voltages VS1, VS5, VS8 and VS11 are applied to the selected word line. The associated memory cells of CP1 can be divided into lower tail memory cells having Vth<VS1 (Vth distribution 1110c) and upper tail memory cells having Vth>VS1 (Vth distribution 1110d). The associated memory cells of CP2 can be divided into lower tail memory cells having Vth<VS2 (Vth distribution 1120c) and upper tail memory cells having Vth>VS2 (Vth distribution 1120d). The associated memory cells of CP3 can be divided into lower tail memory cells having Vth<VS3 (Vth distribution 1130c) and upper tail memory cells having Vth>VS3 (Vth distribution 1130d). The associated memory cells of CP4 can be divided into lower tail memory cells having Vth<VS4 (Vth distribution 1140c) and upper tail memory cells having Vth>VS4 (Vth distribution 1140d).

For memory cells assigned to the S1, S5, S8 or S11 data state which have a Vth greater than the respective verify voltage, their programming is completed. For memory cells which are not assigned to the S1, S5, S8 or S11 data state which have a Vth greater than the respective verify voltage, their future programming in the second, foggy program pass can be guided by knowing that they are relatively fast programming memory cells. For memory cells which have a Vth less than the respective verify voltage, their future programming can be guided in the second, foggy program pass by knowing that they are relatively slow programming memory cells. This can apply to memory cells assigned to any programmed data state, including the S1, S5, S8 or S11 data states. For example, relatively slow programming memory cells can receive relatively more program pulses than relatively fast programming memory cells in the second, foggy program pass. Bit line voltages can also be adjusted to provide partial speed programming for the relatively fast programming memory cells. By adjusting the amount of programming for the memory cells based on their program speed, narrower Vth distributions can be achieved in the second, foggy program pass.

For example, see FIG. 13B which provides examples of program pulses and bit line voltages for the relatively slow programming (lower tail) memory cells and FIG. 13C which provides examples of program pulses and bit line voltages for the relatively fast programming (upper tail) memory cells.

By using a verify voltage of a data state to distinguish the slower and faster programming memory cells, some memory cells can also be identified which have completed programming, as mentioned. Although, it is possible to distinguish the slower and faster programming memory cells using a voltage which is not a verify voltage of a data state. It is also possible to distinguish three or more speeds for the memory cells, e.g., slow, medium and fast, by sensing the memory cells using two or more voltages for each checkpoint voltage.

FIG. 12 depicts an example of a program-verify voltage signal in a first program pass which provides the threshold voltage distributions of FIG. 11A. The vertical axis depicts a voltage and the horizontal axis depicts a program loop (PL) number. Each program loop includes a program pulse and one or more verify voltages in this example. The program-verify voltage signal 1200 includes nine program pulses 1201-1209, where each program pulse is followed by one or more verify voltages 1211-1219, respectively, for checkpoint states. For example, the verify voltages 1211 and 1212 include Vcp1 and Vcp2, the verify voltages 1213 and 1214 include Vcp1-Vcp3, the verify voltages 1215 and 1216 include Vcp2-Vcp4, the verify voltages 1217 and 1218 include Vcp3 and Vcp4, and the verify voltage 1219 includes Vcp4. This example delays the use of the higher verify voltages until later program loops, to reduce the number of verify tests.

FIG. 13A depicts a first example of a program voltage signal in a second program pass which provides the threshold voltage distributions of FIG. 11B. The vertical axis depicts a voltage and the horizontal axis depicts a program loop (PL) number. Each program loop includes a program pulse but no verify voltages in this example. The program voltage signal 1300 includes fifteen program pulses 1301-1315. The memory cells of each programmed data state are subject to a specified, predetermined amount of programming which can be defined by a specified number of program pulses (having a specified amplitude and duration) and specified bit line voltages which are applied during these program pulses.

In this example, PL1-PL4 are used for programming the memory cells assigned to the S1-S4 states to the S1ƒ-S4ƒ foggy states, respectively. PL5-PL7 are used for programming the memory cells assigned to the S5-S7 states to the S5ƒ-S7ƒ foggy states, respectively. PL8-PL10 are used for programming the memory cells assigned to the S8-S10 states to the S8ƒ-S10ƒ foggy states, respectively. PL11-PL15 are used for programming the memory cells assigned to the S11-S15 states to the S11ƒ-S15ƒ foggy states, respectively. Thus, a separate set of program pulses is used for programming a group of memory cells associated with a checkpoint state from the checkpoint state to respective foggy states.

In this example, the program pulses increase in each program loop by a fixed amount. However, other options are possible. For example, the amplitude could step up or down when programming a group of memory cells associated with a next checkpoint state. For example, after programming the memory cells associated with CP1 using the program pulses 1301-1304, which may increase by a step size dV1, the amplitude of the program pulse 1305 in PL5 could be more or less than dV1 higher than the amplitude of the program pulse 1304. Or, the amplitude of the program pulse 1305 in PL5 could be lower than the amplitude of the program pulse 1304. The step size can also vary.

FIGS. 13B and 13C provide examples of a specified number of program pulses and specified bit line voltages for use in connection with FIG. 13A. FIG. 13B provides a baseline option, or an option for lower tail cells when the approach of FIG. 11E is used. FIG. 13C provides an option for the upper tail cells when the approach of FIG. 11E is used. A goal of the program pulses and bit line voltages is to increase the Vth for each memory cell by a specified amount to provide a narrow foggy state Vth distribution. For memory cells which are to have a relatively large increase in Vth, a relatively large number of program pulses are applied. The bit line voltage provides a further variable for controlling the increase in Vth during the program pulses.

FIG. 13B depicts a first example of bit line voltages which can be used in connection with the program voltage signal of FIG. 13A. As mentioned, FIG. 13B provides a baseline option, or an option for lower tail cells when the approach of FIG. 11E is used. The example provides a table with columns identifying a program loop number (PL#), and bit line voltages for the programmed data states, e.g., Vbl (S1) to Vbl (S15). "Inhibit" indicates a bit line voltage which inhibits programming, e.g., Vbl=1.5-2 V. "Full speed" indicates a bit line voltage which allows a full speed programming, e.g., Vbl=0 V. This example does not use a partial programming speed bit line voltage, but see the example of FIG. 13C.

Memory cells assigned to S1 can be programmed using a single program pulse, in PL1, since their Vth only has to increase a small amount from the CP1 state, as depicted by the increase from the Vth distribution 1110 to the Vth distribution 1111 in FIG. 11B.

Memory cells assigned to S2 can be programmed using two program pulses, in PL1 and PL2, to provide an increase from the Vth distribution 1110 to the Vth distribution 1112 in FIG. 11B.

Memory cells assigned to S3 can be programmed using three program pulses, in PL1-PL3, to provide an increase from the Vth distribution 1110 to the Vth distribution 1113 in FIG. 11B.

Memory cells assigned to S4 can be programmed using four program pulses, in PL1-PL4, to provide an increase from the Vth distribution 1110 to the Vth distribution 1114 in FIG. 11B.

Memory cells assigned to S5 can be programmed using one program pulse, in PL5, to provide an increase from the Vth distribution 1120 to the Vth distribution 1121 in FIG. 11B.

Memory cells assigned to S6 can be programmed using two program pulses, in PL5 and PL6, to provide an increase from the Vth distribution 1120 to the Vth distribution 1122 in FIG. 11B.

Memory cells assigned to S7 can be programmed using three program pulses, in PL5-PL7, to provide an increase from the Vth distribution 1120 to the Vth distribution 1123 in FIG. 11B.

Memory cells assigned to S8 can be programmed using one program pulse, in PL8, to provide an increase from the Vth distribution 1130 to the Vth distribution 1131 in FIG. 11B.

Memory cells assigned to S9 can be programmed using two program pulses, in PL8 and PL9, to provide an increase from the Vth distribution 1130 to the Vth distribution 1132 in FIG. 11B.

Memory cells assigned to S10 can be programmed using three program pulses, in PL8-PL10, to provide an increase from the Vth distribution 1130 to the Vth distribution 1133 in FIG. 11B.

Memory cells assigned to S11 can be programmed using one program pulse, in PL11, to provide an increase from the Vth distribution 1140 to the Vth distribution 1141 in FIG. 11B.

Memory cells assigned to S12 can be programmed using two program pulses, in PL11 and PL12, to provide an increase from the Vth distribution 1140 to the Vth distribution 1142 in FIG. 11B.

Memory cells assigned to S13 can be programmed using three program pulses, in PL11-PL13, to provide an increase from the Vth distribution 1140 to the Vth distribution 1143 in FIG. 11B.

Memory cells assigned to S14 can be programmed using four program pulses, in PL11-PL14, to provide an increase from the Vth distribution 1140 to the Vth distribution 1144 in FIG. 11B.

Memory cells assigned to S15 can be programmed using five program pulses, in PL11-PL15, to provide an increase from the Vth distribution 1140 to the Vth distribution 1145 in FIG. 11B.

A formula in FIG. 13B is that, for a data state which is the ith state in a group of states associated with a checkpoint state, where i=1, 2 . . . , the associated memory cells are programmed with i program pulses with Vbl=full speed. For example, for CP1 and the associated group of states S1-S4, S3 is the i=3rd state which is programmed using three program pulses (in PL1-PL3) with Vbl=full speed.

FIG. 13C depicts a second example of bit line voltages which can be used in connection with the program voltage signal of FIG. 13A. As mentioned, FIG. 13C provides an option for the upper tail cells when the approach of FIG. 11E is used. The upper tail cells will receive a reduced amount of programming compared to the lower tail cells. The example provides a table with columns identifying a program loop number (PL#), and bit line voltages for the programmed data states, e.g., Vbl (S1) to Vbl (S15). "Partial speed" indicates a bit line voltage, e.g., Vbl=0.5 V, which allows a reduced speed programming, slower than the full speed programming. A memory cell will have a smaller increase in Vth when a partial programming speed bit line voltage is used, compared to when a full programming speed bit line voltage is used.

Memory cells assigned to S1 can be programmed in PL1 using Vbl=partial speed.

Memory cells assigned to S2 can be programmed in PL1 using Vbl=full speed and in PL2 using Vbl=partial speed.

Memory cells assigned to S3 can be programmed in PL1 and PL2 using Vbl=full speed and in PL3 using Vbl=partial speed.

Memory cells assigned to S4 can be programmed in PL1-PL3 using Vbl=full speed and in PL4 using Vbl=partial speed.

Memory cells assigned to S5 can be programmed in PL5 using Vbl=partial speed.

Memory cells assigned to S6 can be programmed in PL5 using Vbl=full speed and in PL6 using Vbl=partial speed.

Memory cells assigned to S7 can be programmed in PL5 and PL6 using Vbl=full speed and in PL7 using Vbl=partial speed.

Memory cells assigned to S8 can be programmed in PL8 using Vbl=partial speed.

Memory cells assigned to S9 can be programmed in PL8 using Vbl=full speed and in PL9 using Vbl=partial speed.

Memory cells assigned to S10 can be programmed in PL8 and PL9 using Vbl=full speed and in PL10 using Vbl=partial speed.

Memory cells assigned to S11 can be programmed in PL11 using Vbl=partial speed.

Memory cells assigned to S12 can be programmed in PL11 using Vbl=full speed and in PL12 using Vbl=partial speed.

Memory cells assigned to S13 can be programmed in PL11 and PL12 using Vbl=full speed and in PL13 using Vbl=partial speed.

Memory cells assigned to S14 can be programmed in PL11-PL13 using Vbl=full speed and in PL14 using Vbl=partial speed.

Memory cells assigned to S15 can be programmed in PL11-PL14 using Vbl=full speed and in PL15 using Vbl=partial speed.

A formula in FIG. 13C is that, for a data state which is the ith state in a group of states associated with a checkpoint state, where i=1, 2 . . . , the associated memory cells are programmed with (i−1) program pulses with Vbl=full speed followed by one program pulse with Vbl=full speed. For example, for CP1 and the associated group of states S1-S4, S3 is the i=3rd state which is programmed using two program pulses (in PL1 and PL2) with Vbl=full speed followed by one program pulse (in PL3) with Vbl=partial speed. Other formulas are possible.

FIG. 13D depicts a second example of a program voltage signal in a second program pass which provides the threshold voltage distributions of FIG. 11B. The vertical axis depicts a voltage and the horizontal axis depicts a program loop (PL) number. Each program loop includes a program pulse but no verify voltages in this example. The program voltage signal 1350 includes sixteen program pulses 1351-1366. As in FIG. 13A, the memory cells of each programmed data state are subject to a specified, predetermined amount of programming.

In this example, some program pulses are used for programming multiple (e.g., two) groups of memory cells, that is, memory cells associated with multiple checkpoint states. This approach can save time by reducing the total number of program pulses or, as in this example, allow a finer grained programming in the foggy program pass by providing a larger number of program pulses for one or more groups of memory cells.

PL1-PL5 are used for programming the memory cells assigned to the S1-S4 states to the S1f-S4f foggy states, respectively. PL5-PL8 are used for programming the memory cells assigned to the S5-S7 states to the S5f-S7f foggy states, respectively. PL8-PL11 are used for programming the memory cells assigned to the S8-S10 states to the S8f-S10f foggy states, respectively. PL11-PL16 are used for programming the memory cells assigned to the S11-S15 states to the S11f-S15f foggy states, respectively. Thus, PL5 is used for programming memory cells of CP1 and CP2, PL8 is used for programming memory cells of CP2 and CP3, and PL11 is used for programming memory cells of CP3 and CP4.

FIG. 13E depicts an example of bit line voltages which can be used in connection with the program voltage signal of FIG. 13D.

Memory cells assigned to S1 can be programmed in PL1 using Vbl=full speed and in PL2 using Vbl=partial speed.

Memory cells assigned to S2 can be programmed in PL1 and PL2 using Vbl=full speed and in PL3 using Vbl=partial speed.

Memory cells assigned to S3 can be programmed in PL1-PL3 using Vbl=full speed and in PL4 using Vbl=partial speed.

Memory cells assigned to S4 can be programmed in PL1-PL4 using Vbl=full speed and in PL5 using Vbl=partial speed.

Memory cells assigned to S5 can be programmed in PL5 using Vbl=full speed and in PL6 using Vbl=partial speed.

Memory cells assigned to S6 can be programmed in PL5 and PL6 using Vbl=full speed and in PL7 using Vbl=partial speed.

Memory cells assigned to S7 can be programmed in PL5-PL7 using Vbl=full speed and in PL8 using Vbl=partial speed.

Memory cells assigned to S8 can be programmed in PL8 using Vbl=full speed and in PL9 using Vbl=partial speed.

Memory cells assigned to S9 can be programmed in PL8 and PL9 using Vbl=full speed and in PL10 using Vbl=partial speed.

Memory cells assigned to S10 can be programmed in PL8-PL10 using Vbl=full speed and in PL11 using Vbl=partial speed.

Memory cells assigned to S11 can be programmed in PL11 using Vbl=full speed and in PL12 using Vbl=partial speed.

Memory cells assigned to S12 can be programmed in PL11 and PL12 using Vbl=full speed and in PL13 using Vbl=partial speed.

Memory cells assigned to S13 can be programmed in PL11-PL13 using Vbl=full speed and in PL14 using Vbl=partial speed.

Memory cells assigned to S14 can be programmed in PL11-PL14 using Vbl=full speed and in PL15 using Vbl=partial speed.

Memory cells assigned to S15 can be programmed in PL11-PL15 using Vbl=full speed and in PL16 using Vbl=partial speed.

A formula in FIG. 13E is that, for a data state which is the ith state in a group of states associated with a checkpoint state, where i=1, 2 . . . , the associated memory cells are programmed with i program pulses with Vbl=full speed followed by one program pulse with Vbl=partial speed. For example, for CP1 and the associated group of states S1-S4, S3 is the i=3rd state which is programmed using three program pulses (in PL1-PL3) with Vbl=full speed followed by one program pulse (in PL4) with Vbl=partial speed.

Other options are possible in FIGS. 13B, 13C and 13E.

Figure 14A:
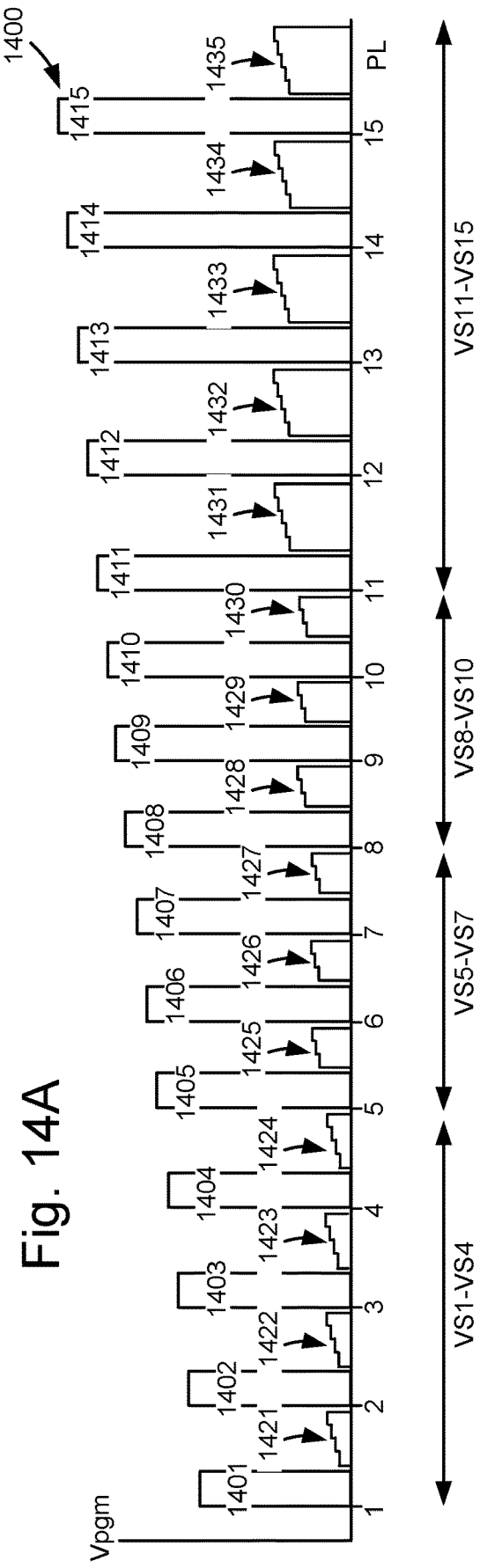
FIG. 14A depicts a first example of a program-verify voltage signal in a third program pass which provides the threshold voltage distributions of FIG. 11C.
Figure 14B:
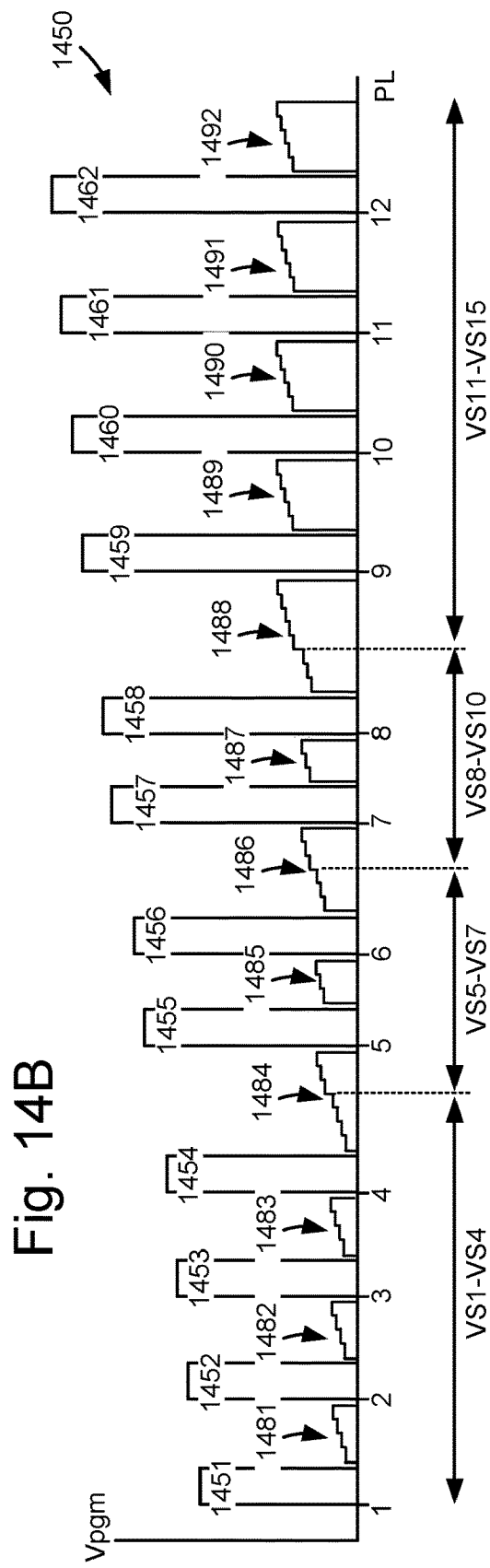
FIG. 14B depicts a second example of a program-verify voltage signal in a third program pass which provides the threshold voltage distributions of FIG. 11C.

FIG. 14A depicts a first example of a program-verify voltage signal in a third program pass which provides the threshold voltage distributions of FIG. 11C. In FIGS. 14A and 14B, the vertical axis depicts a voltage and the horizontal axis depicts a program loop (PL) number.

Each program loop includes a program pulse and one or more verify voltages in this example. The program voltage signal 1400 includes fifteen program pulses 1401-1415, where each program pulse is followed by one or more verify voltages 1421-1435, respectively, for the assigned data states. For example, the verify voltages 1421-1424 include VS1-VS4, the verify voltages 1425-1427 include VS5-VS7, the verify voltages 1428-1430 include VS8-VS10, and the verify voltages 1431-1435 include VS11-VS15. This example delays the use of the higher verify voltages until later program loops, to reduce the number of verify tests. Additionally, the verify tests of each program loop are dedicated to one group of memory cells and one set of data states. For example, verify tests for S1-S4 (set(1)), S5-S7 (set(2)), S8-S10 (set(3)) and S11-S15 (set(4)) are performed in PL1-PL4, PL5-PL7, PL8-PL10 and PL1-PL15, respectively.

FIG. 14B depicts a second example of a program-verify voltage signal in a third program pass which provides the threshold voltage distributions of FIG. 11C. In this example, the verify tests of a program loop can be used for multiple groups of memory cells. This helps reduce the number of program loops and potentially the program time.

The program voltage signal 1450 includes twelve program pulses 1451-1462, where each program pulse is followed by one or more verify voltages 1481-1492, respectively, for the assigned data states. For example, the verify voltages 1481-1484 include VS1-VS4, while the verify voltages 1484 also include VS5-VS7. The verify voltages 1485 and 1486 include VS5-VS7, while the verify voltages 1486 also include VS8-VS10. The verify voltages 1487 and 1488 include VS8-VS10, while the verify voltages 1488 also include VS11-VS15. The verify voltages 1489-1492 include VS11-VS15.

The verify signals of PL4, PL6 and PL8 therefore include verify tests for two groups of memory cells and two sets of data states. For example, verify tests for S1-S4 (set(1)) and S5-S7 (set(2)) are performed in PL4, verify tests for S5-S7 (set(2)) and S8-S10 (set(3)) are performed in PL6, and verify tests for S8-S10 (set(3)) and S11-S15 (set(4)) are performed in PL8.

Figure 15:
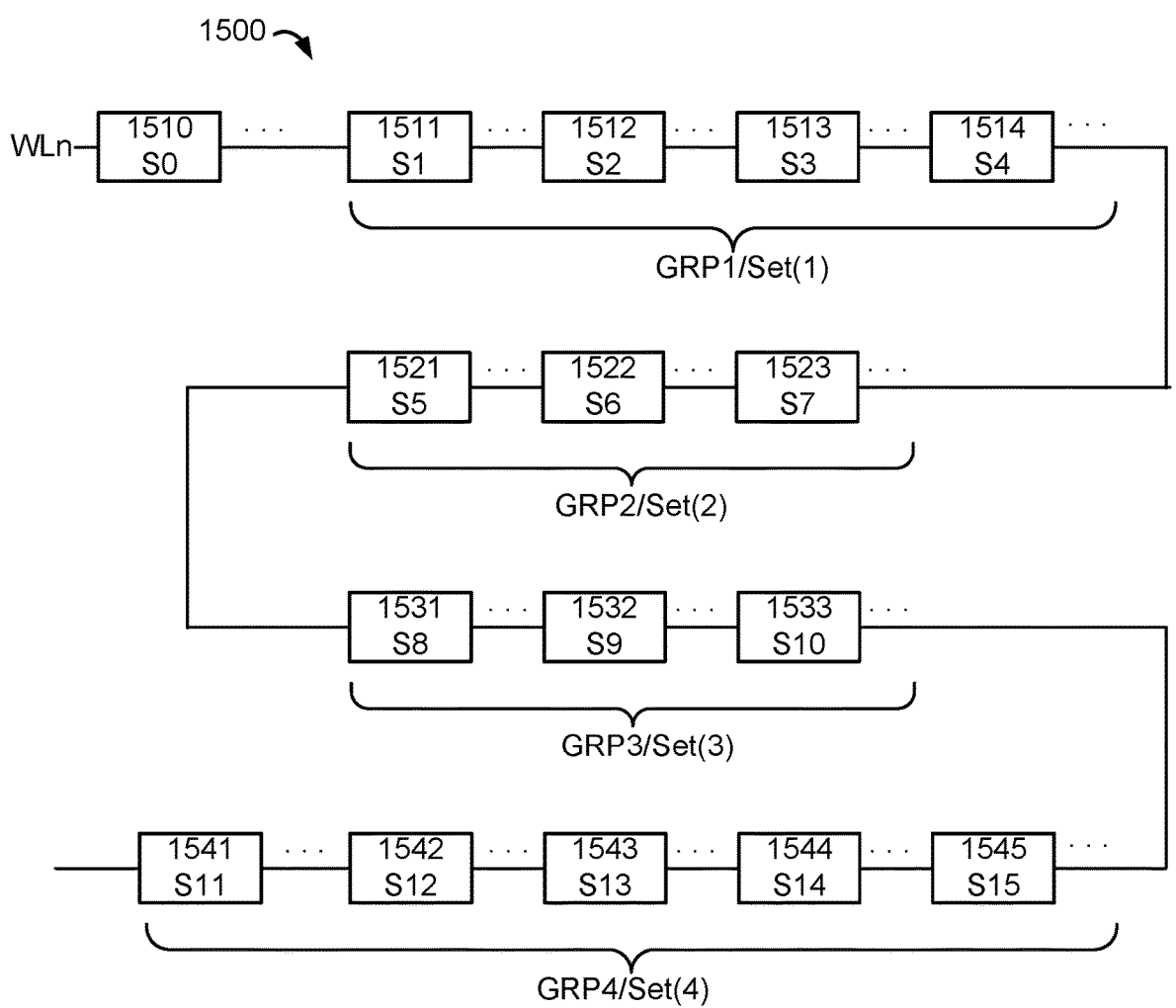
FIG. 15 depicts groups of memory cells associated with the checkpoint states and sets of data states of the first example program operation FIG. 11A.

FIG. 15 depicts groups of memory cells associated with the checkpoint states and sets of data states of the first example program operation FIG. 11A. A set of memory cells 1500 is connected to a selected word line WLn. The set can include groups of memory cells GRP1-GRP4 associated with checkpoint states CP1-CP4, respectively, and assigned to the sets of data states set(1)-set(4), respectively. A memory cell 1510 is in the erased (S0) state and is not in a group. Generally, memory cells assigned to each of the programmed states is in a group but other approaches are possible. In GRP1, memory cells 1511-1514 are assigned to the S1-S4 data states, respectively, in set(1). In GRP2, memory cells 1521-1523 are assigned to the S5-S7 data states, respectively, in set(2). In GRP3, memory cells 1531-1533 are assigned to the S8-S10 data states, respectively, in set(3). In GRP4, memory cells 1541-1545 are assigned to the S11-S15 data states, respectively, in set(4).

The memory cells positioned along a word lines have assigned data states which are typically randomly assigned. Accordingly, a group of memory cells will typically be dispersed at different locations along the word line. This example depicts the groups in a simplified representation.

FIG. 16A depicts threshold voltage distributions after a first program pass in a second example program operation, consistent with FIG. 10C, where verify tests are performed using checkpoint voltages Vcp1a-Vcp4a. Compared to FIG. 11A-11C, FIG. 16A-16C have different groups of data states associated with each checkpoint. Moreover, the verify voltages for the checkpoint states and the data states can differ. For example, the verify voltages for the checkpoint states CP1-CP4 are Vcp1a-Vcp4a, respectively, and the verify voltages for the data states S1-S15 are VS1a-VS15a, respectively. In FIG. 16A-16C, the number of data states associated with a checkpoint state is greatest for the lowest checkpoint state (CP1) and lowest for the higher checkpoint states (CP3 and CP4). Also, the minimum spacing between the verify voltages of the data states is greatest for the lowest set (set(1a)) of data states and lowest for the highest set (set(4a)) of data states. One set of data states is higher than another set of data states when the verify voltages of the one set of data states are higher than the verify voltages of the another set of data states. This example helps provide an additional margin when disturbs primarily affect the lower data states and data retention loss for the higher states is small. In contrast, in FIG. 11A-11C, the minimum spacing between the verify voltages of the data states is greatest for the lowest (set(1)) and highest (set(4)) sets and lowest for the mid-range sets (set(2), set(3)). This helps provide an additional margin for disturb of the lower data states and data retention loss of the higher states. A mid-range set of data states is between the lowest and highest sets of data states.

The examples of FIGS. 11A-11C and 16A-16C both include four checkpoint states but this number can vary.

After erasing the memory cells, the Vth distribution 1600 is obtained, representing the erased state.

The memory cells are then subject to the first program pass of the program operation. The memory cells assigned to the S1-S5, S6-S9, S10-S12 and S13-S15 data states are programmed to the CP1-CP4 states using the verify voltages Vcp1a-Vcp4a, respectively. The CP1-CP4 states are represented by the Vth distributions 1610, 1620, 1630 and 1640, respectively.

FIG. 16B depicts threshold voltage distributions after a second program pass in a second example program operation, consistent with FIG. 10D. For example, the memory cells assigned to the S1-S5 data states are programmed from the CP1 state to S1f-S5f states (f denotes foggy), respectively, as represented by the Vth distributions 1611-1615, respectively. The memory cells assigned to the S6-S9 data states are programmed from the CP2 state to S6f-S6f states, respectively, as represented by the Vth distributions 1621-1624, respectively. The memory cells assigned to the S10-S12 data states are programmed from the CP3 state to S8f-S10f states, respectively, as represented by the Vth distributions 1631-1633, respectively. The memory cells assigned to the S13-S15 data states are programmed from the CP4 state to S13f-S15f states, respectively, as represented by the Vth distributions 1641-1643, respectively.

FIG. 16C depicts threshold voltage distributions after a third program pass in a second example program operation, consistent with FIG. 10E, where verify tests are performed using verify voltages VS1a-VS15a. The memory cells assigned to the S1-S15 data states are programmed from the S1f-S15f foggy states to the S1-S15 data states as represented by the Vth distributions 1651-1655, 1661-1664, 1671-1673 and 1681-1683. The memory cells assigned to the S1-S5 data states are subject to a verify test using the verify voltages VS1a-VS5a, respectively, the memory cells assigned to the S6-S9 data states are subject to a verify test using the verify voltages VS6a-VS9a, respectively, the memory cells assigned to the S10-S12 data states are subject to a verify test using the verify voltages VS10a-VS12a, respectively, and the memory cells assigned to the S13-S15 data states are subject to a verify test using the verify voltages VS13a-VS15a, respectively.

The different groups of memory cells associated with CP1-CP4 are programmed to sets of data states set(la)-set(4a), respectively, In this example, the verify voltages of the data states S1-S5, S6-S9, S10-S12 and S13-S15 are separated by a spacing d4, d5, d6 and d7, respectively. The spacing is uniform within each set of Vth distributions in this example. In other examples, the spacing varies within each set of Vth distributions.

Figure 17:
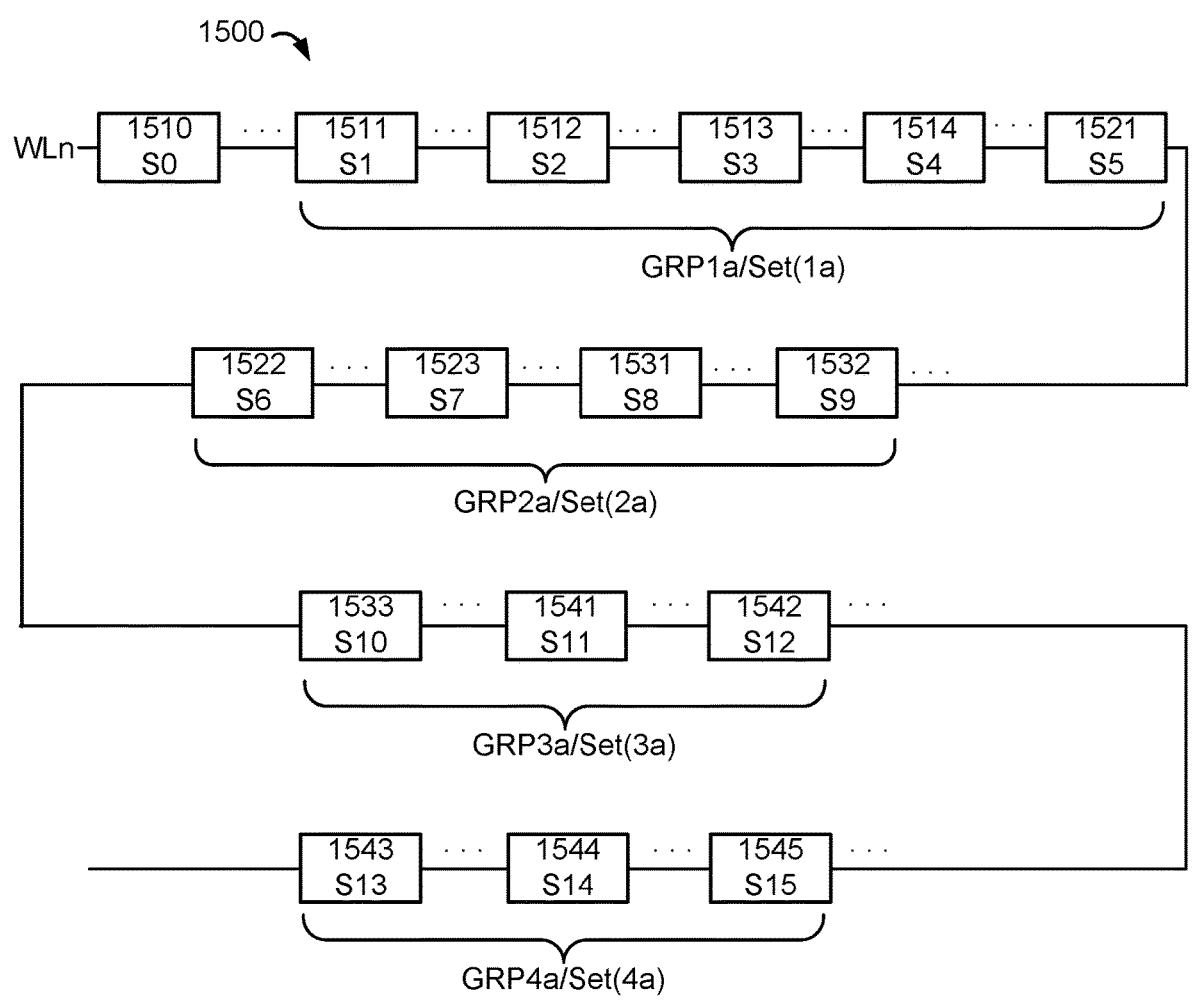
FIG. 17 depicts groups of memory cells associated with the checkpoint states and sets of data states of the second example program operation FIG. 16A.

FIG. 17 depicts groups of memory cells associated with the checkpoint states and sets of data states of the second example program operation FIG. 16A. A set of memory cells 1500 is connected to a selected word line WLn. The set can include groups of memory cells GRP1-GRP4 associated with checkpoint states CP1-CP4, respectively, and assigned to the sets of data states set(la)-set(4a), respectively. A memory cell 1510 is in the erased (S0) state and is not in a group. In GRP1', memory cells 1511, 1512, 1513, 1514 and 1521 are assigned to the S1-S5 data states, respectively, of set(la). In GRP2, memory cells 1522, 1523, 1531 and 1532 are assigned to the S6-S9 data states, respectively, of set(2a). In GRP3, memory cells 1533, 1541 and 1542 are assigned to the S10-S12 data states, respectively, of set(3a). In GRP4, memory cells 1543-1545 are assigned to the S13-S15 data states, respectively, of set(4a).

In FIG. 18A-18G, the vertical dimension denotes voltage and the horizontal dimension denotes time, with time points W413. The period of time depicted corresponds to one program loop and includes a pre-charge phase 1890 (t0-t2), a program phase 1891 (t2-t4), a recovery phase 1892 (t4-t9) and a verify phase 1893 (t9-t13). The voltages depicted are examples.

Figure 18:
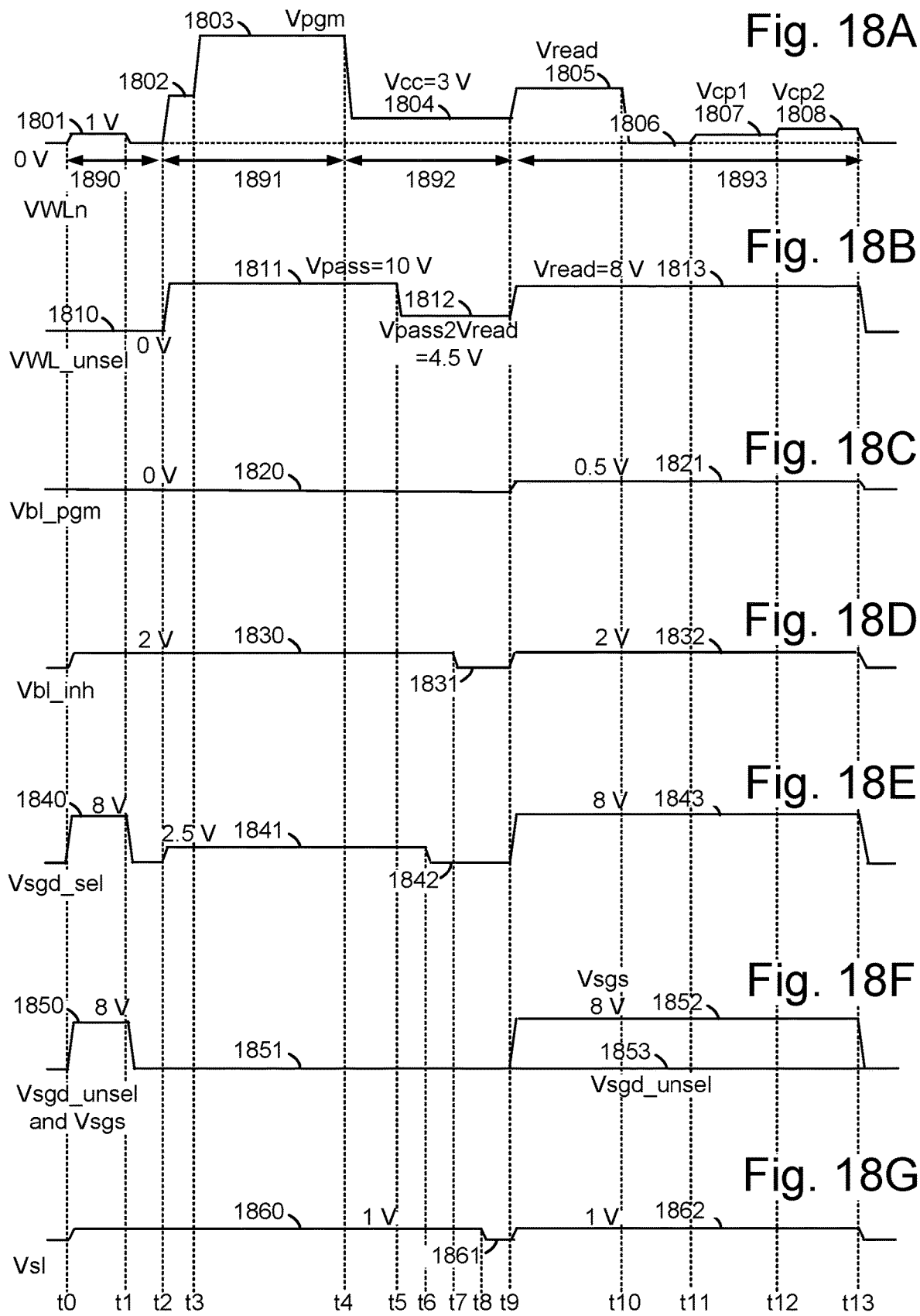
FIG. 18A depicts voltages applied to a selected word line, WLn in a program loop of a program operation, consistent with FIG. 12.
FIG. 18B depicts a voltage, VWL_unsel, applied to unselected word lines, consistent with FIG. 18A.
FIG. 18C depicts a voltage, Vbl_pgm, applied to bit lines of programmed NAND strings, consistent with FIG. 18A.
FIG. 18D depicts a voltage, Vbl_inh, applied to bit lines of inhibited NAND strings, consistent with FIG. 18A.
FIG. 18E depicts a voltage, Vsgd_sel, applied to SGD transistors of a selected sub-block, consistent with FIG. 18A.
FIG. 18F depicts voltages applied to SGD transistors of unselected sub-blocks and to SGS transistors, consistent with FIG. 18A.
FIG. 18G depicts a voltage applied to a source line, consistent with FIG. 18A.

FIG. 18A depicts voltages applied to a selected word line, WLn in a program loop of a program operation, consistent with FIG. 12. This is an example program loop in a first program pass, where a verify phase include checkpoint voltages Vcp1 and Vcp2. The voltages are also consistent with program loops in a second program pass, if the verify phase is omitted. The voltages are also consistent with program loops in a third program pass, if the verify phase is modified to include verify voltages of data states instead of checkpoint voltages.

A plot 1801 represents 1 V, a plot 1802 represents a program pass voltage, Vpass, a plot 1803 represents a program voltage of Vpgm, a plot 1804 represents a positive recovery voltage of Vcc=3 V, a plot 1805 represents a voltage pulse at Vread, a plot 1806 represents 0 V, and plots 1807 and 1808 represent example verify voltages Vcp1 and Vcp2, respectively. During the application of each verify voltage, a sensing operation occurs for the memory cells which are assigned to the checkpoint state being verified. The selected memory cells are connected to a selected word line, and can be in a selected sub-block. A program pulse comprises the plots 1802 and 1803.

FIG. 18B depicts a voltage, VWL_unsel, applied to unselected word lines, consistent with FIG. 18A. A plot 1810 represents 1 V, a plot 1811 represents Vpass=10 V, and a plot 1812 represents a recovery or transition voltage, Vpass2Vread. This refers to a voltage which is applied in a transition from the program pass voltage to the read pass voltage. A plot 1813 represents Vread.

FIG. 18C depicts a voltage, Vbl_pgm, applied to bit lines of programmed NAND strings, consistent with FIG. 18A. A plot 1820 represents 1 V, and a plot 1821 represents 0.5 V.

FIG. 18D depicts a voltage, Vbl_inh, applied to bit lines of inhibited NAND strings, consistent with FIG. 18A. These are inhibited NAND strings in a selected sub-block. A plot 1830 represents 2 V and a plot 1831 represents 0 V at t7-t9 in the recovery phase. A plot 1832 represents 2 V in the verify phase.

FIG. 18E depicts a voltage, Vsgd_sel, applied to SGD transistors of a selected sub-block, consistent with FIG. 18A. A plot 1840 represents 8 V, a plot 1841 represents 2.5 V, a plot 1842 represents 0 V and a plot 1843 represents 8 V.

FIG. 18F depicts voltages applied to SGD transistors of unselected sub-blocks and to SGS transistors, consistent with FIG. 18A. A plot 1850 represents 8 V and a plot 1851 represents 2.5 V for Vsgd_unsel and Vsgs. A plot 1852 represents 8 V for Vsgs and a plot 1853 represents 0 V for Vsgd_unsel.

FIG. 18G depicts a voltage applied to a source line, consistent with FIG. 18A. A plot 1860 represents 1 V, a plot 1861 represents 0 V and a plot 1862 represents 1 V. In the pre-charge phase, a positive Vbl_inh (plot 1830) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. A plot 1831 represents Vbl_inh returning to 0 V at t7-t9 in part of the recovery phase, and a plot 1832 represents Vbl_inh at 2 V during the verify phase, for example.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V.

During the verify phase, the SGD and SGS transistors are in a strongly conductive state to allow sensing to occur for the selected memory cells.

FIG. 19 depicts an example of latch data, consistent with FIG. 10A, step 1002. The data may be stored in latches associated with NAND strings. For example, in FIG. 2, a set of latches (see the four sets of latches 194-197) is associated with each NAND string. In the case of sixteen data states, four bits in the latches can identify the assigned data state of a memory cell in the NAND string. The assigned data states include the erased state S0 and the programmed data states S1-S15. In an example which is consistent with FIG. 10B2, set(1)-set(4) are associated with the data states S1-S4, S5-S7, S8-S10 and S11-S15, respectively. In one example, the LP/LMP/UMP/UP latches store 1/1/1/1, 0/0/0/0, 1/0/0/0, 0/1/0/0, 1/1/0/0, 0/0/1/0, 1/0/1/0, 0/1/1/0, 1/1/1/0, 0/0/0/1, 1/0/0/1, 0/1/0/1, 1/1/0/1, 0/0/1/1, 1/0/1/1, and 0/1/1/1 for the S0-S15 data states, respectively.

A fifth latch PS could also be used to store a bit indicating whether a memory cell is subject to a partial speed programming.

In a first program pass, the latches associated with a memory cell can be read to determine the assigned data state and this information can be used by a control circuit to determine the corresponding checkpoint state. For example, the data of FIG. 10B2 or 10B3 can be used.

In a second program pass, the latches associated with a memory cell can be read to determine the assigned data state and this information can be used by a control circuit to determine a number of program pulses and levels of bit line voltages to use during programming. For example, the data of FIG. 13B, 13C or 13E can be used.

In a third program pass, the latches associated with a memory cell can be read to determine the assigned data state and this information can be used by a control circuit to determine which memory cells receive which verify tests. For example, the data of FIG. 19 can be used. When a memory cell passes the verify tests of its assigned data states, the associated set of latches can be updated to 1/1/1/1 to indicate further programming is to be inhibited.

Accordingly, it can be seen that, in an example implementation, an apparatus comprises a control circuit configured to connect to a set of word lines (e.g., WL0-WL95 in FIG. 8). The set of word lines are connected to a set of memory cells (1500, FIGS. 15 and 17). The set of memory cells can be arranged, e.g., in NAND strings (700n, 700n1, 700n2, 710n, 710n1, 710n2, 720n, 720n1, 720n2, 730n, 730n1, 730n2) in a block (B0-0). The set of word lines comprise a selected word line (WLn) and unselected word lines. The selected word line is connected to a first group of memory cells (GRP1, GRP1a) configured to be programed to a first set of data states (set(1) in FIG. 10B2, set(la) in FIG. 10B3) comprising respective verify voltages (VS1-VS4; VS1a-VS5a) and to a second group of memory cells (GRP2, GRP2a) configured to be programmed to a second set of data states (set(2) in FIG. 10B2, set(2a) in FIG. 10B3) comprising respective verify voltages (VS5-VS7; VS6a-VS9a).

A memory interface is connected to the control circuit. The control circuit is configured to issue a command via the memory interface to perform a program operation for the selected word line, and to perform the program operation, the control circuit is configured to program the first group of memory cells to a first checkpoint state (CP1) and to program the second group of memory cells to a second checkpoint state (CP2), and to program the first group of memory cells from the first checkpoint state to the first set of data states and to program the second group of memory cells from the second checkpoint state to the second set of data states.

A minimum spacing (d1, d4) between the respective verify voltages of the first set of data states is greater than a minimum spacing (d2, d5) between the respective verify voltages of the second set of data states.

The control circuit is configured to set a number of data states (four in FIG. 11C, five in FIG. 16C) in the first set of data states to be greater than a number of data states in the second set of data states (three in FIG. 11C, four in FIG. 16C).

In an option, the respective verify voltages (VS1-VS4, VS1a-VS5a) of the first set of data states are lower than the respective verify voltages (VS5-VS7, V6a-VS9a) of the second set of data states. This approach can be useful when a disturb of the first group of memory cells in the first set of data states is greater than a disturb of the second group of memory cells in the second set of data states. The disturb can be a program or read disturb which occurs after programming, and which increases the upper tail of the Vth distribution of the lower data states. By providing a greater spacing between verify voltages, there will be a greater margin to accommodate the increase of the Vth.

In an option, the selected word line is connected to a third group of memory cells (GRP4) configured to be programmed to a third set of data states (S11-S15) comprising respective verify voltages (VS11-VS15). To perform the program operation, the control circuit is configured to program the third group of memory cells to a third checkpoint state (CP4) and to program the third group of memory cells from the third checkpoint state to the third set of data states, where a minimum spacing (d3) between the respective verify voltages of the third set of data states is greater than the minimum spacing (d2) between the respective verify voltages of the second set of data states. The control circuit is configured to set a number of data states in the third set of data states (five data states) to be greater than the number of data states in the second set of data states (three data states, FIG. 11C).

In the above option, the respective verify voltages (VS1-VS4) of the first set of data states can be lower than the respective verify voltages (VS5-VS7) of the second set of data states, and the respective verify voltages (VS11-VS15) of the third set of data states can be greater than the respective verify voltages of the second set of data states. This approach is useful when a data retention loss of the third group of memory cells in the third set of data states is greater than a data retention loss of the second group of memory cells in the second set of data states. The additional spacing between the verify levels in the third set of data states provides a margin for a downshift in the lower tail of the Vth distributions due to data retention loss without causing read errors. The example of FIG. 11C depicts a relatively large spacing between verify levels for the lowest and highest sets of data states.

In an option, the control circuit is configured to set the number of data states in the first set of data states based on a position of the selected word line in the set of word lines. For example, the number of data states can be a function of the width of the memory hole adjacent to the selected word line, or a function of whether the selected word line is an edge or other boundary word line. Specifically, the control circuit can be configured to set the number of data states in the first set of data states based on whether the selected word line is an edge word line of a block. See, e.g., FIGS. 7A and 7B.

In an option, consistent with FIGS. 6 and 7B, the set of word lines are arranged in a first tier (BT) and a second tier (TT) which is separated from the first tier by an interface region (IF), and the control circuit is configured to set the number of data states in the first set of data states based on whether the selected word line is a boundary word line (WLIF+1, WLIF−1) of the interface region.

In an option, the NAND strings have a varying width along a height of the NAND strings, such as depicted in FIGS. 7A and 7B, and the control circuit is configured to set the number of data states in the first set of data states based on whether the selected word line is at a widest point of the NAND strings.

In an option, the NAND strings are arranged in a selected sub-block among a plurality of sub-blocks of a block, such as one of the sub-blocks SB0-SB3 in FIG. 8, and the control circuit is configured to set the number of data states in the first set of data states based on a position of the selected sub-block among the plurality of sub-blocks of the block. The number of data states can also be based on a sub-block programming order.

In another example implementation, a method comprises performing a program operation for memory cells connected to a selected word line (WLn) in a set of word lines (e.g., WL0-WL95 in FIG. 8). The memory cells can be are arranged in NAND strings (700n, 700n1, 700n2, 710n, 710n1, 710n2, 720n, 720n1, 720n2, 730n, 730n1, 730n2) in a block (B0-0), for example. The selected word line is connected to different groups of memory cells (GRP1-GRP4, GRP1a-GRP4a). The performing the program operation comprises: selecting a set of checkpoint states (CP1-CP4) comprising a respective checkpoint state for each group from among a plurality of available sets of checkpoint states (116a, 116b in FIG. 10B1); performing a first program pass (see, e.g., FIG. 11A or 16A) in which each group of memory cells is programmed to the respective checkpoint state (CP1-CP4) with verify tests; performing a second program pass (see, e.g., FIG. 11B or 16B) in which each group of memory cells is programmed from the respective checkpoint state to one or more foggy states (S1f-S15f) without verify tests; and performing a third program pass (see, e.g., FIG. 11C or 16C) in which each group of memory cells is programmed from the one or more foggy states to data states (S1-S15) with verify tests.

In an option, the selecting of the set of checkpoint states is based on a position of the selected word line in the set of word lines.

In an option, each checkpoint state is associated with a set of data states (set(1)-set(4); set(la)-set(4a)) having respective verify voltages (VS1-VS4, VS5-VS7, VS8-VS10, VS11-VS15 for set(1)-set(4), respectively; VS1a-VS5a, VS6a-VS9a, VS10a-VS12a, VS13a-VS15a for set(la)-set(4a), respectively); and for each checkpoint data state, a number of data states in the set of data states is a function of a minimum spacing between the respective verify voltages.

In an option, for each the checkpoint data state, the number of data states in the set of data states (e.g., five data states in set(4) in FIG. 11C; five data states in set(la) in FIG. 16C) is greatest when the minimum spacing is greatest (e.g., d3>d1 and d2 in FIG. 11C; d4>d5, d6 and d7 in FIG. 16C).

In an option, a number of data states in the set of data states is higher for a lowest set than for a mid-range set (e.g., five data states S1-S5 in set(1) compared to four data states S6-S9 in set(2) or three data states S10-S12 in set(3) in FIG. 16C).

In another implementation, an apparatus comprises a control circuit configured to connect to a set of word lines. The set of word lines comprise a selected word line and unselected word lines, the selected word line is connected to different groups of memory cells (GRP1-GRP4, GRP1a-GRP4a), and the control circuit, to perform a programming operation, is configured to: program each group of memory cells to a respective checkpoint state (CP1-CP4, CP1a-CP4a), each respective checkpoint state is associated with a set of data states (set(1)-set(4); set(1a)-set(4a)) having verify voltages (VS1-VS4, VS5-VS7, VS8-VS10, VS11-VS15 for set(1)-set(4), respectively; VS1a-VS5a, VS6a-VS9a, VS10a-VS12a, VS13a-VS15a for set(la)-set(a4), respectively) spaced apart by at least a respective minimum spacing (d1-d3, d4-d7); and program each group of memory cells from the respective checkpoint state to the associated set of data states, wherein a number of data states in each of the associated sets of data states is an increasing function of the respective minimum spacings.

In an option, the respective checkpoint states comprise a respective checkpoint state (CP1) associated with lowest set (set(1), set(1a)) of the sets of data states and a respective checkpoint state (CP2, CP3) associated with a mid-range set (set(2), set(3); set(2a), set(3a)) of the sets of data states; and the respective minimum spacing (d1, d4) is greater for the lowest set than for the mid-range set (d2; d5, d6).

In an option, the respective checkpoint states comprise a respective checkpoint state (CP4) associated with a highest set (set(4a)) of the sets of data states and a respective checkpoint state associated with a mid-range set (set(2a), set(3a)) of the sets of data states; and the respective minimum spacing (d3) is greater for the highest set of states than for the mid-range set (d3).

In an option, the programming of each group of memory cells to the respective checkpoint state occurs in a first program pass with verify tests (see, e.g., FIG. 11A, 16A); the programming of each group of memory cells from the respective checkpoint state to the associated set of data states occurs in a second program pass without verify tests (see, e.g., FIG. 11B, 16B) and in a third program pass with verify tests (see, e.g., FIG. 11C, 16C).

In an option, for at least one respective checkpoint state, the respective minimum spacing of the verify voltages (d1-d3; d4-d7) of the associated set of data states is a function of a position of the selected word line in the set of word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a control circuit configured to connect to a set of word lines, the set of word lines are connected to a set of memory cells, the set of word lines comprise a selected word line and unselected word lines, the selected word line is connected to a first group of memory cells configured to be programed to a first set of data states comprising respective verify voltages and to a second group of memory cells configured to be programed to a second set of data states comprising respective verify voltages; and
    a memory interface connected to the control circuit, the control circuit is configured to issue a command via the memory interface to perform a program operation for the selected word line, and to perform the program operation, the control circuit is configured to program the first group of memory cells to a first checkpoint state and to program the second group of memory cells to a second checkpoint state, and to program the first group of memory cells from the first checkpoint state to the first set of data states and to program the second group of memory cells from the second checkpoint state to the second set of data states;

a minimum spacing between the respective verify voltages of the first set of data states is greater than a minimum spacing between the respective verify voltages of the second set of data states; and a number of data states in the first set of data states is greater than a number of data states in the second set of data states.

2. The apparatus of claim 1, wherein:
the respective verify voltages of the first set of data states are lower than the respective verify voltages of the second set of data states; and
a disturb of the first group of memory cells in the first set of data states is greater than a disturb of the second group of memory cells in the second set of data states.

3. The apparatus of claim 1, wherein:
the selected word line is connected to a third group of memory cells configured to be programed to a third set of data states comprising respective verify voltages;
to perform the program operation, the control circuit is configured to program the third group of memory cells to a third checkpoint state and to program the third group of memory cells from the third checkpoint state to the third set of data states;
a minimum spacing between the respective verify voltages of the third set of data states is greater than the minimum spacing between the respective verify voltages of the second set of data states; and
a number of data states in the third set of data states is greater than the number of data states in the second set of data states.

4. The apparatus of claim 3, wherein:
the respective verify voltages of the first set of data states are lower than the respective verify voltages of the second set of data states; and
the respective verify voltages of the third set of data states are greater than the respective verify voltages of the second set of data states.

5. The apparatus of claim 4, wherein:
a data retention loss of the third group of memory cells in the third set of data states is greater than a data retention loss of the second group of memory cells in the second set of data states.

6. The apparatus of claim 1, wherein:
the control circuit is configured to set the number of data states in the first set of data states based on a position of the selected word line in the set of word lines.

7. The apparatus of claim 1, wherein:
the number of data states in the first set of data states is based on whether the selected word line is an edge word line of the set of word lines.

8. The apparatus of claim 1, wherein:
the set of word lines are arranged in a first tier and a second tier which is separated from the first tier by an interface region; and
the number of data states in the first set of data states is based on whether the selected word line is a boundary word line of the interface region.

9. The apparatus of claim 1, wherein:
the set of memory cells are arranged in NAND strings;
the NAND strings have a varying width along a height of the NAND strings; and the number of data states in the first set of data states is based on whether the selected word line is at a widest point of the NAND strings.

10. The apparatus of claim 1, wherein:
the set of memory cells are arranged in NAND strings in a block;
the NAND strings are arranged in a selected sub-block among a plurality of sub-blocks of the block; and
the number of data states in the first set of data states is based on a position of the selected sub-block among the plurality of sub-blocks of the block.

11. A method, comprising:
performing a program operation for memory cells connected to a selected word line in a set of word lines, and the selected word line is connected to different groups of memory cells, the performing the program operation comprises:
    selecting a set of checkpoint states comprising a respective checkpoint state for each group from among a plurality of available sets of checkpoint states;
    performing a first program pass in which each group of memory cells is programmed to the respective checkpoint state with verify tests;
    performing a second program pass in which each group of memory cells is programmed from the respective checkpoint state to one or more foggy states without verify tests; and
    performing a third program pass in which each group of memory cells is programmed from the one or more foggy states to data states with verify tests.

12. The method of claim 11, wherein:
the selecting of the set of checkpoint states is based on a position of the selected word line in the set of word lines.

13. The method of claim 12, wherein:
each checkpoint state is associated with a set of data states having respective verify voltages; and
for each checkpoint data state, a number of data states in the set of data states is a function of a minimum spacing between the respective verify voltages.

14. The method of claim 13, wherein:
for each checkpoint data state, the number of data states in the set of data states is greatest when the minimum spacing is greatest.

15. The method of claim 12, wherein:
each checkpoint state is associated with a set of data states; and
a number of data states in the set of data states is higher for a lowest checkpoint state than for a mid-range checkpoint state.

16. An apparatus, comprising:
a control circuit configured to connect to a set of word lines, the set of word lines are connected to memory cells, the set of word lines comprise a selected word line and unselected word lines, the selected word line is connected to different groups of memory cells, and the control circuit, to perform a programming operation, is configured to:
    program each group of memory cells to a respective checkpoint state, each respective checkpoint state is associated with a set of data states having verify voltages spaced apart by at least a respective minimum spacing; and
    program each group of memory cells from the respective checkpoint state to the associated set of data states, wherein a number of data states in each of the associated sets of data states is an increasing function of the respective minimum spacings.

17. The apparatus of claim 16, wherein:

the respective checkpoint states comprise a respective checkpoint state for a lowest set of the sets of data states and a respective checkpoint state for a mid-range set of the sets of data states; and the respective minimum spacing is greater for the lowest set than for the mid-range set.

18. The apparatus of claim 16, wherein:

the respective checkpoint states comprise a respective checkpoint state associated with a highest set of the sets of data states and a respective checkpoint state associated with a mid-range set of the sets of data states; and the respective minimum spacing is greater for the highest set than for the mid-range set.

19. The apparatus of claim 16, wherein:

the programming of each group of memory cells to the respective checkpoint state occurs in a first program pass with verify tests; and the programming of each group of memory cells from the respective checkpoint state to the associated set of data states occurs in a second program pass without verify tests and in a third program pass with verify tests.

20. The apparatus of claim 16, wherein:

for at least one respective checkpoint state, the respective minimum spacing of the verify voltages of the associated set of data states is a function of a position of the selected word line in the set of word lines.

\* \* \* \* \*